United States Patent
Yoshihara et al.

(10) Patent No.: US 12,148,582 B2
(45) Date of Patent: Nov. 19, 2024

(54) INPUT DEVICE

(71) Applicant: Panasonic Intellectual Property Management Co., Ltd., Osaka (JP)

(72) Inventors: Satoshi Yoshihara, Hyogo (JP); Kota Araki, Osaka (JP); Hiroaki Nishiono, Osaka (JP); Kenji Shibata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 80 days.

(21) Appl. No.: 17/913,082

(22) PCT Filed: Mar. 16, 2021

(86) PCT No.: PCT/JP2021/010664
§ 371 (c)(1),
(2) Date: Sep. 20, 2022

(87) PCT Pub. No.: WO2021/193250
PCT Pub. Date: Sep. 30, 2021

(65) Prior Publication Data
US 2023/0170166 A1   Jun. 1, 2023

(30) Foreign Application Priority Data
Mar. 27, 2020   (JP) .................................. 2020-059109

(51) Int. Cl.
*H01H 25/04*   (2006.01)
(52) U.S. Cl.
CPC ..... *H01H 25/041* (2013.01); *H01H 2025/043* (2013.01)
(58) Field of Classification Search
CPC ...... H01H 3/125; H01H 13/705; H01H 13/14; H01H 13/04; H01H 13/10; H01H 13/70;
(Continued)

(56) References Cited

U.S. PATENT DOCUMENTS

| | | | |
|---|---|---|---|
| 7,129,854 B2* | 10/2006 | Arneson | H01H 13/785 |
| | | | 455/66.1 |
| 2009/0164062 A1* | 6/2009 | Aoki | B60Q 1/0082 |
| | | | 701/36 |

FOREIGN PATENT DOCUMENTS

| JP | 2002-181640 A | 6/2002 |
|---|---|---|
| JP | 2012-129027 A | 7/2012 |

(Continued)

OTHER PUBLICATIONS

International Search Report dated Jun. 22, 2021 issued in International Patent Application No. PCT/JP2021/010664, with English translation.

*Primary Examiner* — Ahmed M Saeed
(74) *Attorney, Agent, or Firm* — Rimon P.C.

(57) ABSTRACT

An input device is provided which is configured such that no matter which position on an operation surface is pushed, the detection sensitivity of the pushing load is suppressed from varying due to different operation positions on the operation surface. An input device includes a first pressing member, a second pressing member, and a substrate. The first pressing member has an operation surface and a first axis and is tiltable around the first axis by the operation surface being pushed. The second pressing member has a second shaft and is tiltable around the second shaft by being pushed by a tilt of the first pressing member. The substrate includes at least one pressure sensor which is to be pushed by the second pressing member. A position of the first axis in the first pressing member is variable in accordance with a pushed position on the operation surface.

20 Claims, 14 Drawing Sheets

(58) Field of Classification Search
CPC ............. H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20; H01H 25/041; H01H 2025/043; H01H 2003/0293; H01H 2025/048; H01H 2239/006; H01H 25/04; H03K 17/975
See application file for complete search history.

(56) References Cited

FOREIGN PATENT DOCUMENTS

| | | | |
|---|---|---|---|
| JP | 2013-251183 | A | 12/2013 |
| JP | 2014-175194 | A | 9/2014 |
| JP | 2016-066513 | A | 4/2016 |

\* cited by examiner

INPUT DEVICE

CROSS-REFERENCE OF RELATED APPLICATIONS

This application is the U.S. National Phase under 35 U.S.C. § 371 of International Patent Application No. PCT/JP2021/010664, filed on Mar. 16, 2021, which in turn claims the benefit of Japanese Patent Application No. 2020-059109, filed on Mar. 27, 2020, the entire disclosures of which Applications are incorporated by reference herein.

TECHNICAL FIELD

The present disclosure relates to input devices. The present disclosure specifically relates to an input device configured to receive an input operation given by an operator.

BACKGROUND ART

Patent Literature 1 discloses a force sensing device (input device). The force detecting device of Patent Literature 1 includes: two inner electrodes on a substrate; and a washer-shaped displacement electrode on an operation body (operation surface). Each of the two inner electrodes forms capacitance between the displacement electrode and itself, thereby constituting a pressure sensor. The force detecting device is configured to detect a pushing load input to the operation body with reference to a change in the capacitance of the respective pressure sensors.

The sensitivities of the respective pressure sensors, however, usually vary. Therefore, even if the same pushing load is input to the operation body, a detected pushing load may be different depending on the position where the pushing load is input.

CITATION LIST

Patent Literature

Patent Literature 1: JP 2002-181640 A

SUMMARY OF INVENTION

It is an object of the present disclosure to provide an input device configured such that no matter which position on an operation surface is pushed, as long as a pushing load is the same, the detection sensitivity of the pushing load is suppressed from varying due to different operation positions on the operation surface.

An input device of an aspect of the present disclosure includes a first pressing member, a second pressing member, and a substrate. The first pressing member has an operation surface and a first axis and is tiltable around the first axis by the operation surface being pushed. The second pressing member has a second axis and is tiltable around the second axis by being pushed by the first pressing member thus tilted. The substrate includes at least one pressure sensor which is to be pushed by the second pressing member. A position of the first axis in the first pressing member is variable in accordance with a pushed position on the operation surface.

DESCRIPTION OF EMBODIMENTS

1. Embodiment

1-1 Summary

An input device 1 according to the present embodiment will be described in detail with reference to the drawings. A configuration described in the embodiment is a mere example of the present disclosure. The present disclosure is not limited to the embodiment, and various modifications may be made to the embodiment depending on design, and the like without departing from the technical idea of the present disclosure.

Figure 1:
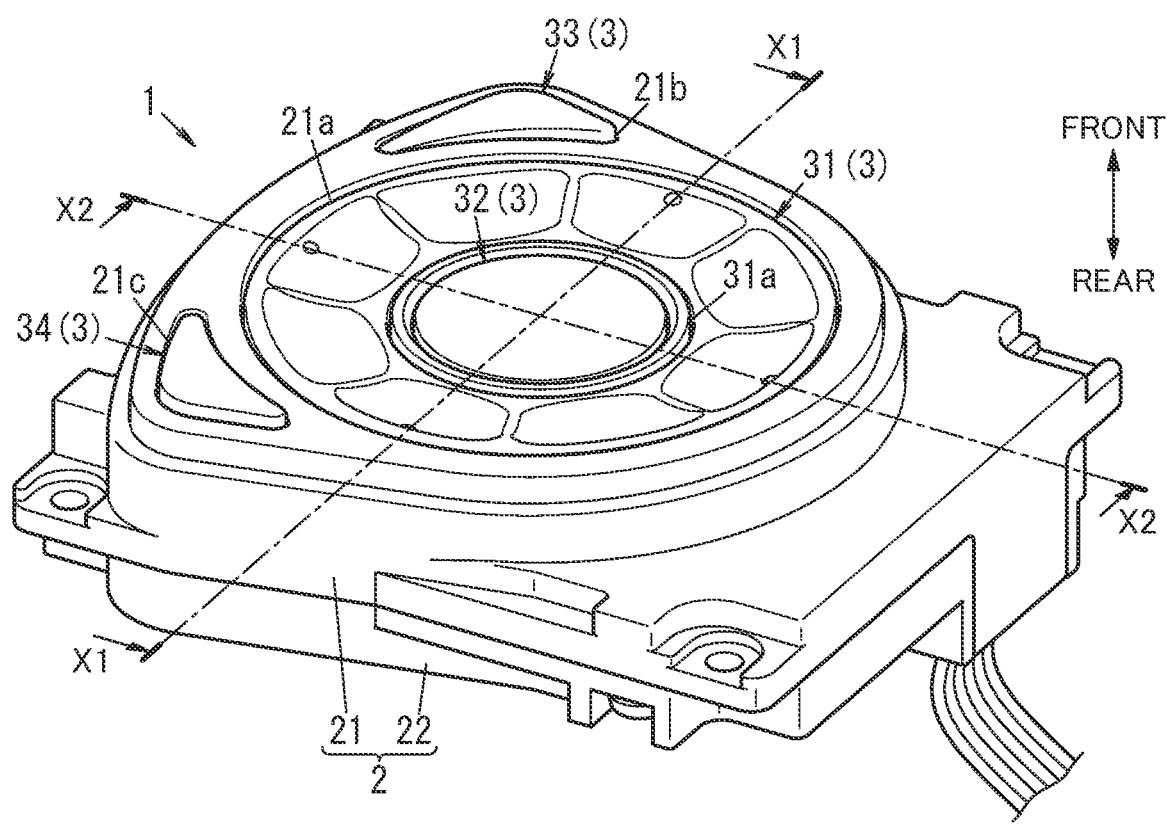
FIG. 1 is a perspective view of an input device according to an embodiment.

Referring to FIG. 1, the overview of the input device 1 will be described. As shown in FIG. 1, the input device 1 is a device which receives an input operation given by an operator. The input device 1 may be mounted on, for example, a spoke portion of a steering wheel of, for example, an automobile.

The input device 1 includes a housing 2, one or more (e.g., three) operation parts 3, and various components.

Here, in the present embodiment, one side on which the operation parts 3 are disposed is defined as the front side (front direction) of the input device 1, and the other side is defined as the rear side (rear direction) of the input device 1, but such definition of the direction does not limit the function of the input device 1.

The housing 2 supports the operation parts 3 and houses and holds the various components described above. The housing 2 is, for example, box-shaped and is substantially rectangular in plan view. The housing 2 has a plurality of openings 21a, 21b, and 21c formed in its front surface. The opening 21a is circular, and the two openings 21b and 21c are substantially triangular, for example. The housing 2 includes a cover 21 and a base 22.

Each of the operation parts 3 is a part to which an operation is given by an operator. The one or more operation parts 3 include an operation panel 31 and three push buttons 32, 33, and 34. The operation panel 31 is an operation part which receives a touch operation and a push operation. The operation panel 31 has, for example, a circularly annular shape having an opening 31a formed in the center thereof. Here, the touch operation is an operation of touching the operation part 3 with a finger and includes an operation of tracing the operation part 3 with the finger. The push operation is an operation of depressing the operation part 3. The push buttons 32, 33, and 34 are operation parts which receive the push operation. The push button 32 is a push button disposed in the opening 31a formed in the operation panel 31 and is, for example, circular in plan view. The push buttons 33 and 34 are push buttons respectively disposed in the openings 21b and 21c on an outer circumferential side of the operation panel 31 and each has, for example, a triangular shape in plan view. Hereinafter, the push button 32 is also referred to as a center button 32, and the push buttons 33 and 34 are respectively referred to as side buttons 33 and 34.

The various components described above include members for supporting the operation parts 3 and circuits for detecting an operation given to the operation parts 3.

In the input device 1, when a touch operation is given to a position on the operation panel 31, the position to which the touch operation is given is detected. Moreover, when a push operation is given to a position on the operation panel 31, the push operation thus given is detected, and then, when the operation panel is further depressed, a pushing load input to the operation panel 31 is detected. When a push operation is given to each of the push buttons 32, 33, and 34, the push operation is detected.

The input device 1 is, as will be described later, configured such that no matter which position on the operation panel 31 is pushed, substantially the same pushing load is detected as long as the pushing load is the same. Thus, the pressure sensing accuracy of the operation panel 31 is improved. Further, the operation panel 31 is configured to further receive a touch operation, and therefore, various operations can be input to the operation panel 31. The present embodiment includes the push buttons 32, 33, and 34 in addition to the operation panel 31, but the push buttons 32, 33, and 34 may be omitted.

1-2. Configuration

Figure 2:
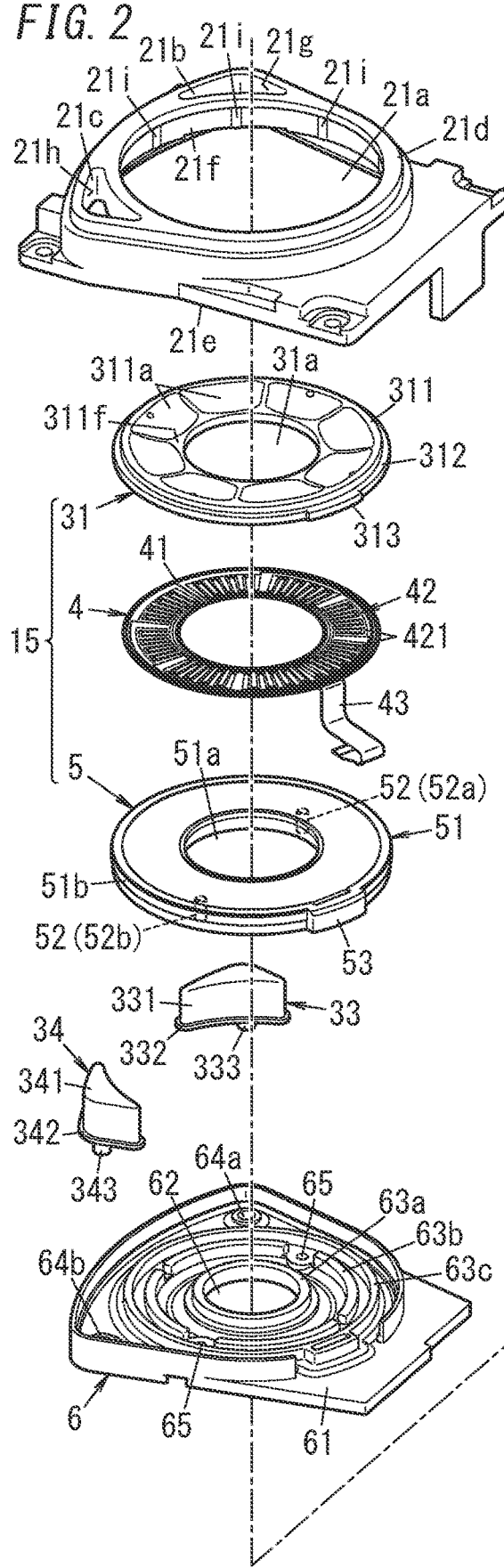
FIG. 2 is an exploded perspective view of the input device.
Figure 2:
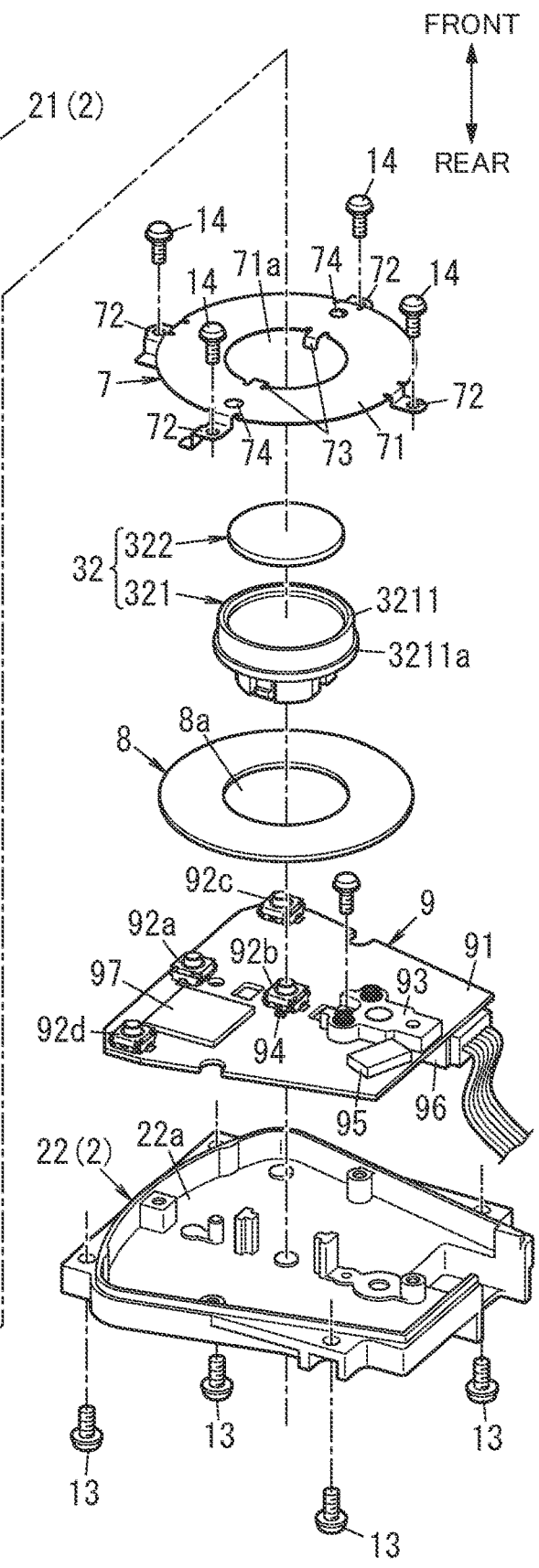
Figure 3:
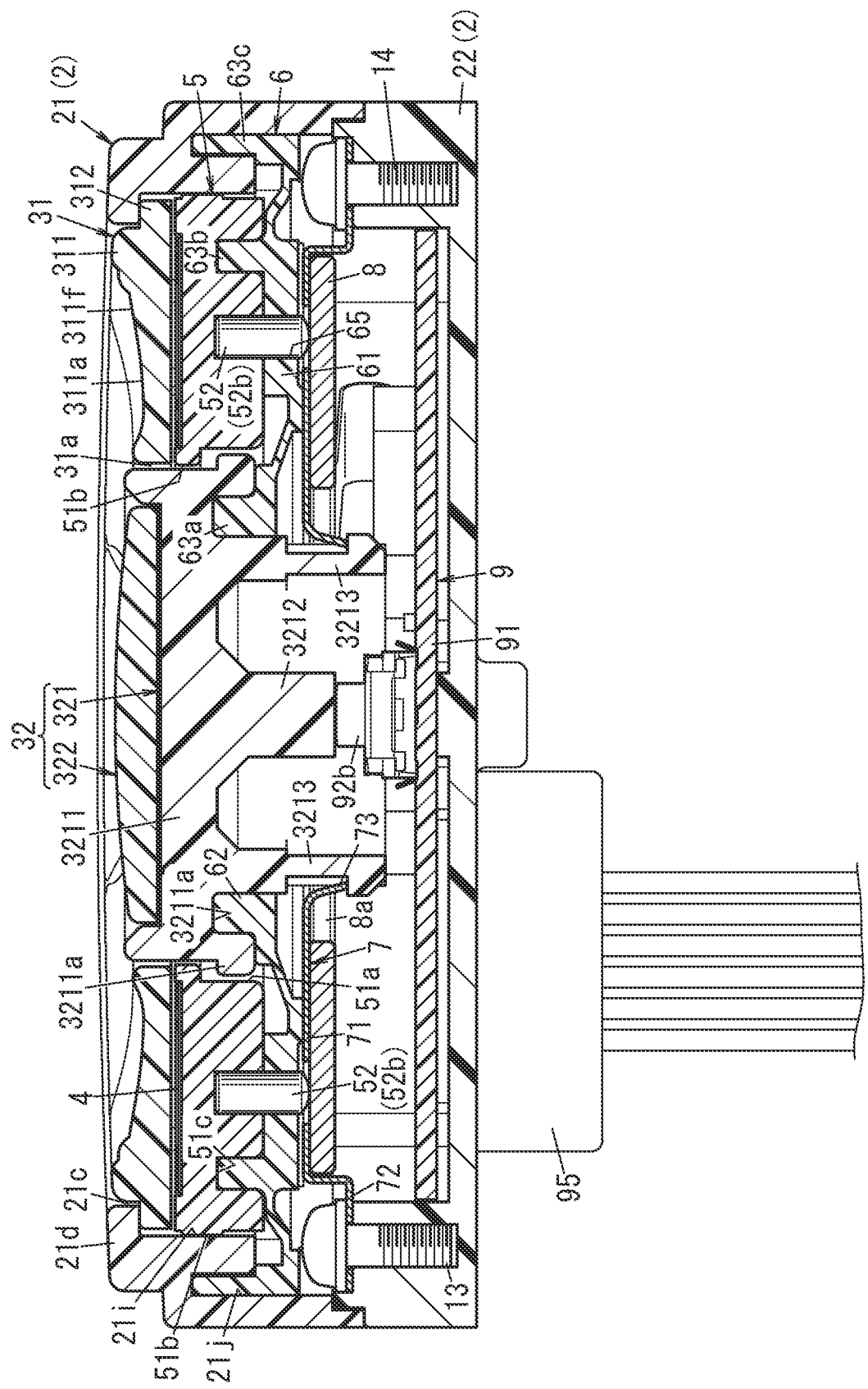
FIG. 3 is a sectional view along X1-X1 of FIG. 1.
Figure 4:
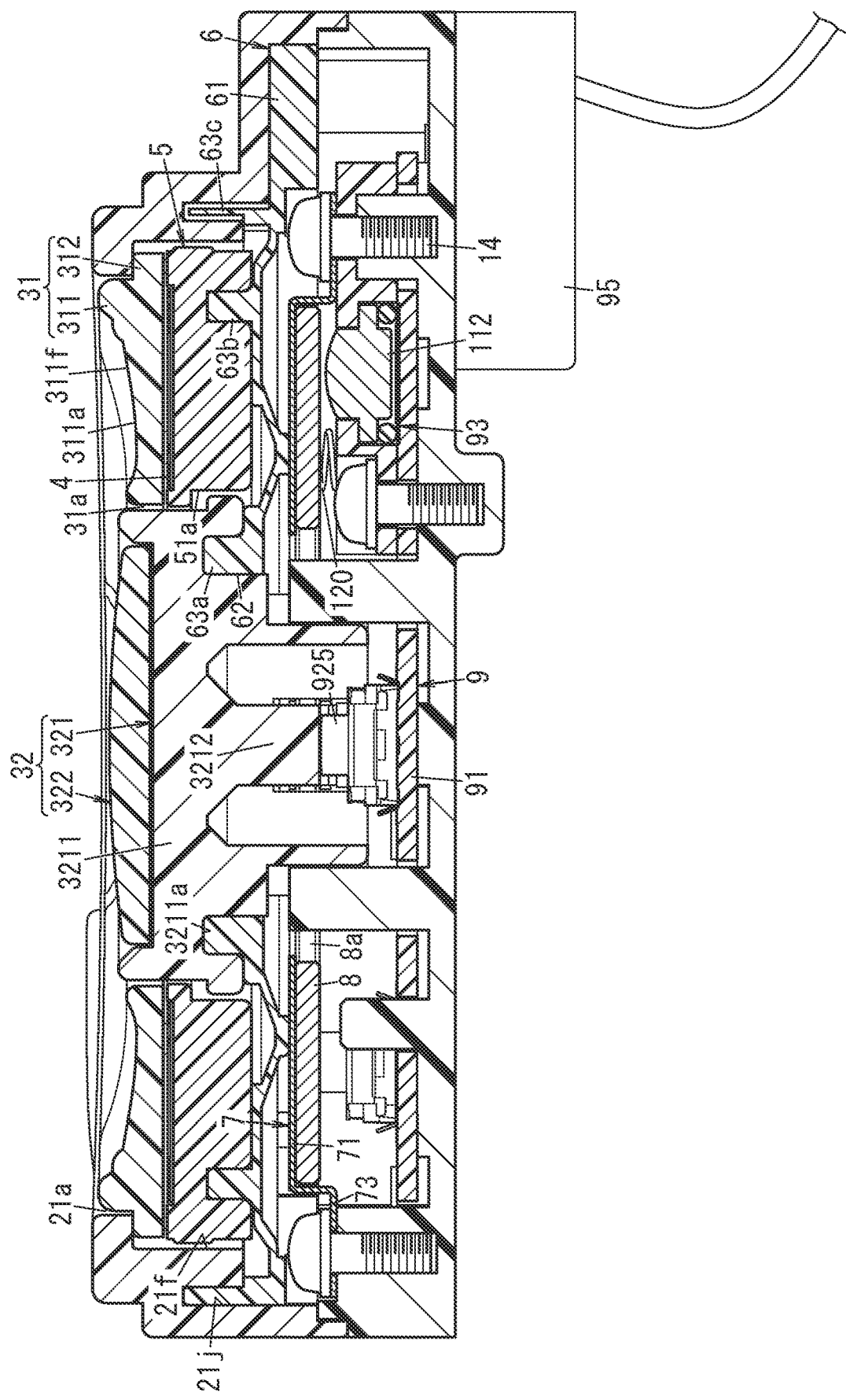
FIG. 4 is a sectional view along X2-X2 of FIG. 1.

Referring to FIGS. 2 to 4, the configuration of the input device 1 will be described. As shown in FIG. 2, the input device 1 includes a sensor substrate 4, a sensor holder 5, a rubber mat 6, a fixing bracket 7, a push plate 8, and a main substrate 9 (substrate) in addition to the housing 2 (holding member) and the operation parts 3.
(Housing)

The housing 2 (holding member) has the cover 21 and the base 22 as described above.

The cover 21 houses and holds various components (e.g., the sensor substrate 4 (touch sensor), the sensor holder 5, the rubber mat 6, the fixing bracket 7, the push plate 8, and the main substrate 9 (substrate)). The cover 21 is made of, for example, a resin.

The cover 21 has, for example, a box shape having at least a front surface 21d and a rear surface 21e having an opening. The cover 21 has the three openings 21a, 21b, and 21c in the front surface 21d. The opening 21a is an opening in which the operation panel 31 is to be disposed, is provided in the center of the front surface 21d of the cover 21, and is for example, circular in plan view. The openings 21b and 21c are openings in which the push buttons 33 and 34 are respectively disposed, and the openings 21b and 21c each has, for example, a triangular shape in plan view. The cover 21 has an inner surface provided with a plurality of peripheral walls 21f, 21g, and 21h individually surrounding the openings 21a, 21b, and 21c, respectively. The peripheral wall 21f restricts the lateral movement of the sensor holder 5 disposed in opening 21a. The peripheral walls 21g and 21h respectively restrict the lateral movement of the side buttons 33 and 34 disposed in the openings 21b and 21c.

The base 22 is a member that closes the rear surface 21e of the cover 21 with the various components being housed in the cover 21. The base 22 is made of, for example, a resin. The base 22 has, for example, a box shape having an upper surface 22a having an opening. When the upper surface 22a of the base 22 is attached to the rear surface 21e of the cover 21, the base 22 closes the rear surface 21e of the cover 21 (see FIGS. 3 and 4). The cover 21 and the base 22 are fixed to each other by, for example, screws 13.
(Operation Panel)

The operation panel 31 is a part which receives the push operation and the touch operation given by the operator. The operation panel 31 has, for example, an annular plate shape (e.g., circularly annular shape) having an opening 31a formed in the center thereof. The opening 31a is circular. The operation panel 31 includes a panel body 311, a flange 312, and a projection 313. The panel body 311 has, for example, an annular plate shape. The flange 312 protrudes to an outer circumferential side at a rear edge of an outer circumferential surface of the panel body 311 and is provided along the entire circumference of the panel body 311. The projection 313 is a portion to be caught in a predetermined recess of the peripheral wall 21f of the cover 21 and protrudes outward from an outer circumferential surface of the flange 312. The panel body 311 has a front surface 311f provided with a plurality of (e.g., eight) concave surface parts 311a for improving operability. The plurality of concave surface parts 311a are arranged along the circumferential direction of the panel body 311. The front surface 311f of the panel body 311 (i.e., front surface of the operation panel 31) constitutes an operation surface which receives an operation.

The operation panel 31 is disposed in the opening 21a of the cover 21 (see FIGS. 3 and 4). In this state, the front surface 311f of the operation panel 31 is exposed on the front side from the opening 21a of the cover 21. The flange 312 of the operation panel 31 contacts a circumferential edge on the rear side of the opening 21a. This prevents the operation panel 31 from falling frontward. The flange 312 of the operation panel 31 comes into contact, in an annular shape, with the cover 21.
(Sensor Substrate)

The sensor substrate 4 is a circuit board which detects a touch operation given to the operation panel 31. The sensor substrate 4 is, for example, a flexible printed circuit board. The sensor substrate 4 is, for example, a circularly annular plate and is provided on a rear surface of the operation panel 31 (see FIGS. 3 and 4). The sensor substrate 4 includes a substrate body 41 having a circularly annular plate shape, a sensing electrode 42, and a line lead-out part 43 (see FIG. 5). The substrate body 41 has, for example, a circularly annular sheet shape. The sensing electrode 42 is an electrode for detecting a touch position on the operation panel 31. The line lead-out part 43 is a part for connecting a line from the sensing electrode 42 to the main substrate 9. The line lead-out part 43 is connected to the main substrate 9.

The sensing electrode 42 has a plurality of (e.g., eight) split electrodes 421. The plurality of split electrodes 421 are disposed on a front surface of the substrate body 41 and are annularly arranged in the circumferential direction of the substrate body 41. The plurality of split electrodes 421 are arranged along the circumferential direction of the substrate body 41, for example, in 45 degree increments. The plurality of split electrodes 421 correspond to the plurality of concave surface parts 311a of the operation panel 31 on a one-to-one basis. Each of the split electrodes 421 is disposed on the rear side of a corresponding one of the concave surface parts 311a and detects a touch operation given to the corresponding one of the concave surface parts 311a. Each of the split electrodes 421 constitutes a capacitor as described later and detects a change in the capacitance of the capacitor by the touch operation given to a corresponding one of the concave surface parts 311a. Thus, each of the split electrodes 421 detects a touch operation given to the corresponding one of the concave surface parts 311a.

Figure 5:
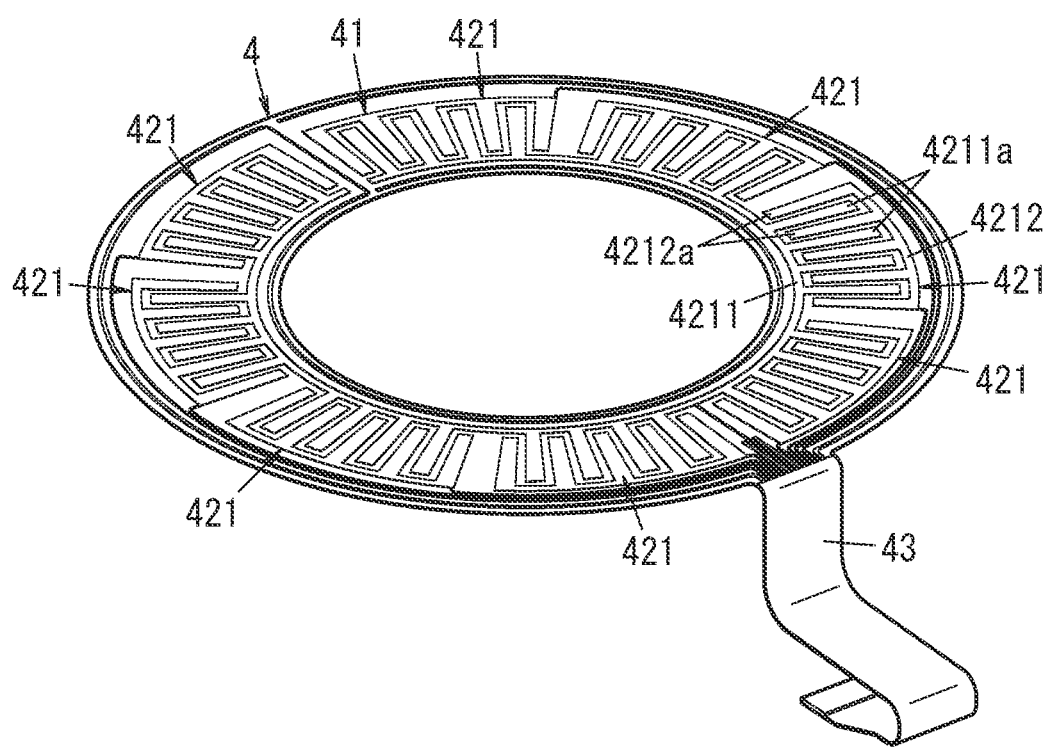
FIG. 5 is a perspective view of a sensor substrate.

Each of the split electrodes 421 has, for example, a fan shape (see FIG. 5). Each split electrode 421 has a drive electrode 4211 and a receiving electrode 4212 (see FIG. 5). The drive electrode 4211 has a comb shape having a plurality of comb teeth 4211a. The receiving electrode 4212 has a comb shape having a plurality of comb teeth 4212a. The receiving electrode 4212 is disposed on an outer circumferential side of the sensing electrode 42. The drive electrode 4211 is disposed on an inner circumferential side of the sensing electrode 42. The plurality of comb teeth 4211a of the drive electrode 4211 protrude radially outward of sensing electrode 42. The plurality of comb teeth 4212a of the receiving electrode 4212 protrude radially inward of the sensing electrode 42. The plurality of comb teeth 4211a of the drive electrode 4211 are disposed between the plurality of comb teeth 4212a of the receiving electrode 4212. The drive electrode 4211 and the receiving electrode 4212 may be exchanged in terms of their arrangement. Each of the split electrodes 421 forms a capacitor between the drive electrode 4211 and the receiving electrode 4212 to charge an electrostatic charge between the drive electrode 4211 and the receiving electrode 4212. The electrostatic charge amount (capacitance) of the capacitor varies as a finger is moved toward and away from (approaches and distances itself from) the operation panel 31, that is, depending on the distance of the finger from the split electrode 421.

The receiving electrodes 4212 of the split electrodes 421 are individually connected to lines, and their lines are drawn to the line lead-out part 43. The potentials of the receiving electrodes 4212 of the split electrodes 421 can be detected from the potentials of these lines. The drive electrodes 4211 of the split electrodes 421 are electrically connected to each other and are connected to a common line. The common line is drawn to the line lead-out part 43. From the potential of this common line, the potentials of the drive electrodes 4211 thus connected are detectable. From the potential of each of the individual lines and the common line, a change in the capacitance of a corresponding one of the split electrodes 421 (i.e., whether or not a touch operation is given to a corresponding one of the concave surface parts 311a) is detectable.

Figure 6A:
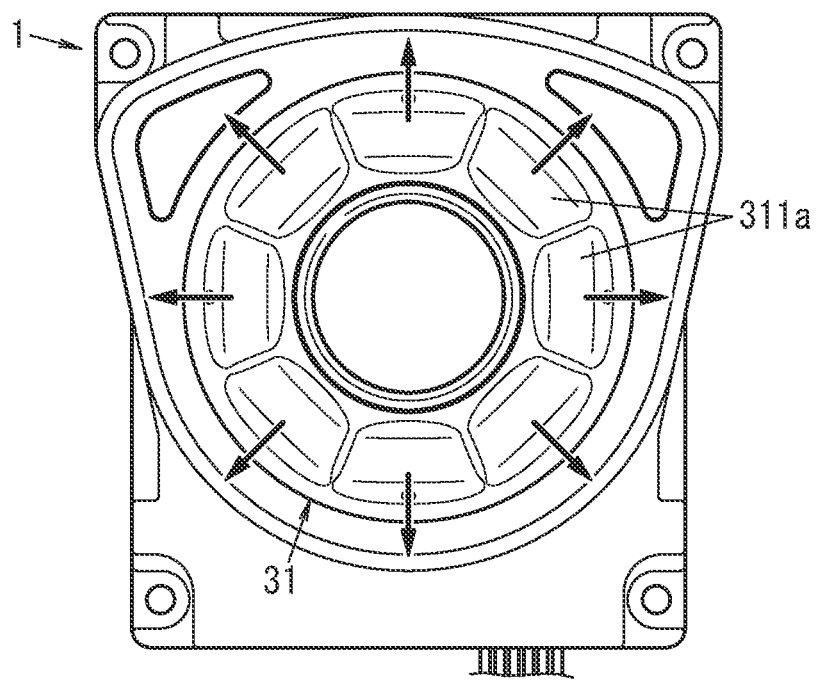
FIG. 6A is an explanatory diagram for explaining how to use the input device as an 8-direction switch.
Figure 6B:
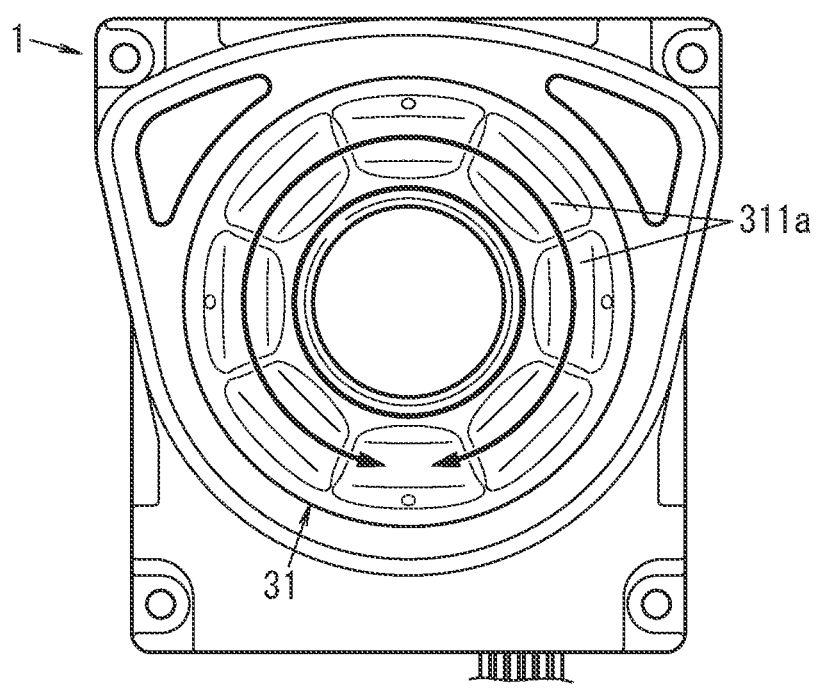
FIG. 6B is an explanatory diagram for explaining how to use the input device as an increment encoder.

As described above, the sensor substrate 4 can individually detect a touch operation given to each concave surface part 311a of the operation panel 31 by a corresponding one of the split electrodes 421. Thereby, an operation of selecting any one of directions (i.e., eight directions) corresponding to the plurality of (e.g., eight) concave surface parts 311a is also detectable. That is, the operation panel 31 can be used as an 8-way switch (see FIG. 6A). Further, when an operation of tracing the operation panel 31 along the circumferential direction is given, it is possible to detect the tracing direction (clockwise or anticlockwise), and from which position (which concave surface part 311a) to which position (which concave surface part 311a) the operation panel 31 is traced (i.e., how many degrees out of 360 degrees have been traced). That is, the operation panel 31 can be used as an operation part of the increment encoder type (see FIG. 6B).

(Sensor Holder)

The sensor holder 5 is a member which supports the operation panel 31 and the sensor substrate 4. The operation panel 31, the sensor substrate 4 and the sensor holder 5 are integrated into one piece constituting a first pressing member 15. The sensor holder 5 has a circularly annular plate shape and is made of, for example, a resin. The sensor holder 5 has a circularly annular plate shape, in plan view, having the same shape and size as the operation panel 31. The sensor holder 5 has a front surface to which the operation panel 31 is to be fixed with the sensor substrate 4 being provided between the front surface and the operation panel 31.

The sensor holder 5 includes a holder main body 51, two pins 52, and a protrusion 53. The holder main body 51 has a circularly annular plate shape having an opening 51a. The two pins 52 are contacts that contact the second pressing member 8 described later (i.e., the push plates described later). The two pins 52 are provided so as to protrude from a rear surface of the holder body 51 and are arranged point-symmetrically with respect to the center of the holder body 51 in plan view. When the two pins 52 are distinguished from each other, they are referred to as two pins 52a and 52b. The protrusion 53 is a part that is caught in a predetermined recess formed in the peripheral wall 21f of the cover 21.

The sensor holder 5 is disposed at the back of the opening 21a of the cover 21 and on an inner side of the peripheral wall 21f (see FIGS. 3 and 4). The sensor holder 5 is laterally positioned by the flange 51b and the plurality of ribs 21i of the cover 21. Note that the flange 51b protrudes outward from an outer circumferential surface of the sensor holder 5. The plurality of ribs 21i are provided at equal intervals along the peripheral wall 21f of the cover 21.

Further, the protrusion 53 of the sensor holder 5 is caught in the predetermined recess formed in the peripheral wall 21f of the cover 21, thereby restricting the rotation of the sensor holder 5 with respect to the cover 21. The sensor holder 5 is swingably held within the cover 21.

(Side Button)

The side buttons 33 and 34 are parts which receive a push operation. Further, the side buttons 33 and 34 respectively correspond to push switches 92c and 92d and respectively press the push switches 92c and 92d in response to the push operation.

The side buttons 33 and 34 are made of, for example, resin in a columnar shape having a substantially triangular shape in plan view. Since the side buttons 33 and 34 have the same shape, only the shape of the side button 33 will be described, and the description of the shape of the side button 34 will be omitted. The side button 33 includes a button body 331, a flange 332, and a pin 333. The flange 332 is a part to be caught by a rear end of the peripheral wall 21g of the cover 21. The flange 332 is caught by the rear end of the peripheral wall 21g, thereby preventing the side button 33 from falling out of the opening 21b. The pin 333 is a part which presses the push switch 92c via the rubber mat 6 and protrudes from a rear surface of the button body 331. Likewise, the side button 34 includes a button body 341, a flange 342, and a pin 343. The side buttons 33 and 34 are disposed in the openings 21b and 21c of the cover 21 so as to be movable in the front and rear directions by receiving the push operation.

(Rubber Mat)

The rubber mat 6 is a member which elastically supports the sensor holder 5 and the push buttons 32, 33, and 34. The sensor holder 5 and the push button 32, 33, 34 are depressed by a push operation, and in this state, the push operation is then released. Then, the rubber mat 6 returns the sensor holder 5 and the push button 32, 33, 34 to their original positions (standby positions) by the elastic force thereof. The original position (standby position) is a position where no push operation is given. The rubber mat 6 is made of a material having rubber elasticity, for example, in a substantially flat plate shape.

The rubber mat 6 includes a substrate part 61, an opening 62, a plurality of (e.g., three) ribs 63a, 63b, and 63c, two insertion holes 64a and 64b, and two through holes 65. The substrate part 61 has a flat plate shape. The opening 62 is provided at the center of the substrate part 61, and the center button 32 is disposed in the opening 62. The ribs 63a are parts to be fit into annular grooves 3211a (see FIG. 3) on a rear surface of the center buttons 32, protrude frontward from a circumferential edge of the opening 62 on a front surface of the substrate part 61, and are provided in a circularly annular shape on the circumferential edge of the opening 62. The rib 63b is a is a part to be fit into an annular groove 51c of the rear surface of the sensor holder 5, protrudes frontward on the front surface of the substrate part 61, and is provided in a circularly annular shape on the outer circumference of the rib 63a. The rib 63c is a part to be fit into an annular groove 21j (see FIG. 3) of the inner surface of the cover 21, protrudes frontward on the front surface of the substrate part 61 and is provided in a circularly annular shape on the outer circumference of the rib 63b. the rear surface of the center button 32, the rear surface of the sensor holder 5, and the inner surface of the cover 21 respectively have the annular grooves 3211a, 51c, and 21j into which the ribs 63a, 63b, and 63c are to be fit (see FIG. 3).

The two insertion holes 64a and 64b are holes which the pins 333 and 343 of the two side buttons 33 and 34 respectively penetrate. The two through holes 65 are holes which the two pins 52 of the sensor holder 5 penetrate. The two through holes 65 are provided at positions facing the two pins 52.

The center button 32 and the sensor holder 5 are connected to a front surface of the rubber mat 6 by fitting the ribs 63a and 63b respectively into the annular grooves 3211a and 51c respectively of the center button 32 and the sensor holder 5 (see FIGS. 3 and 4). In this state the center button 32 is disposed in the opening 62 of the rubber mat 6, the sensor holder 5 (and thus, the first pressing member 15) is disposed on the outer circumference of the center button 32. Further, to the front surface of the rubber mat 6, the side buttons 33 and 34 are connected by penetrating the pins 333 and 343 of the side buttons 33 and 34 respectively through the insertion holes 64a and 64b. In this state, the side buttons 33 and 34 are disposed on the outer circumference of the sensor holder 5.

The rubber mat 6 is disposed so as to close a rear surface of the cover 21 (see FIGS. 3 and 4). In this state, the rib 63c of the rubber mat 6 fits into the annular groove 21j of the cover 21. As a result, the rubber mat 6 is positioned and disposed on the rear surface of the cover 21. The rubber mat 6 closes the rear surface of the cover 21, thereby preventing dust, water, and the like entering the cover 21 through the opening 21a of the cover 21 from farther entering the base 22 (i.e., the main substrate 9). The rubber mat 6 is fixed in the cover 21 by being sandwiched between the cover 21 and the base 22.

(Fixing Bracket)

The fixing bracket 7 is a component which swingably attaches the push plate 8 to the main substrate 9. The fixing bracket 7 is made of, for example, metal to have a circularly annular plate shape. The fixing bracket 7 includes a bracket body 71, a plurality of (e.g., four) fixing pieces 72, a plurality of (e.g., two) hook pieces 73, and two through holes 74. The bracket body 71 is a part to be disposed in front of the push plate 8 and has, for example, a circularly annular plate shape having an opening 71a. The four fixing pieces 72 are parts to be fixed to the base 22, protrude backward from an outer circumferential end of the bracket body 71, and are bent to the outer circumferential side at their intermediate portions. The two hook pieces 73 are parts to be caught in hook claws 3213 of the center button 32. The two hook pieces 73 extend inward and backward from an inner circumferential end of the opening 71a of the bracket body 71. The hook claws 3213 will be described later. The two through holes 74 are holes which the two pins 52 of the sensor holder 5 penetrate.

The fixing pieces 72 are fixed to the base 22 by screws 14, thereby, the fixing bracket 7 is arranged on a front surface of the base 22 (see FIGS. 3 and 4). In this state, between the fixing bracket 7 and the base 22, the push plate 8 and the main substrate 9 are arranged on one another in this order from the front side. The center button 32 is disposed in the opening 71a of the fixing bracket 7. In this state, tip ends of the two hook pieces 73 of the fixing bracket are hooked on the hook claws 3213 of the center button 32. The hook claws 3213 will be described later. As a result, the center buttons 32 are prevented from falling out frontward from the opening 31a of the operation panel 31.

(Center Button)

The center button 32 is a part which receives a push operation. The center button 32 includes a button body 321 and a front surface plate 322. The button body 321 has a base 3211 having, for example, a disk shape, a boss 3212 (see FIG. 3), and the two hook claws 3213 (see FIG. 3). The base 3211 is a part which supports the front surface plate 322. The boss 3212 is a part which presses the corresponding push switch 92b. The boss 3212 protrudes backward in a columnar shape from the center of a rear surface of the base 3211. The two hook claws 3213 are parts by which the two hook pieces 73 of the fixing bracket 7 are to be caught. The two hook claws 3213 are provided on the rear surface of the base 3211 with the boss 3212 provided therebetween and protrude backward. The hook claws 3213 are hooked on the hook pieces 73 of the fixing bracket 7, thereby preventing the center button 32 from falling off frontward from the opening 31a of the operation panel 31.

The annular groove 3211a is a part into which the rib 63a of the rubber mat 6 is to be fit.

The front surface of the base 3211 is provided with the front surface plate 322. The front surface plate 322 is made of, for example, a transparent resin in a disk shape, and letters, diagrams, and the like are printed on the front surface plate 322.

The center button 32 (transparent member) is made of, for example, a transparent resin having light diffusivity. The center button 32 guides light from a light source 94 provided on the main substrate 9 and outputs the light frontward through the front surface plate 322. This causes the front surface plate 322 to emit light.

The center button 32 is disposed so as to be movable in the front/rear direction in the openings 51a and 31a respectively of the sensor holder 5 and the operation panel 31.

(Push Plate)

The push plate 8 is a member which presses a push switch 92a and a pressure sensor 93 provided on the main substrate 9. The push plate 8 constitutes a second pressing member. The push plate 8 is hereinafter also referred to as a second pressing member 8. The push plate 8 is made of a conductive member (e.g., metal, rigid body) in the shape of, for example, a circularly annular plate having an opening 8a. The push plate 8 is disposed in front of the main substrate 9 such that the push plate 8 is swingable with the push plate 8 being laterally positioned by the fixing bracket 7 and frontward and backward movement of the push plate 8 being restricted by the fixing bracket 7. The push plate 8 is disposed on the rear side of the sensor holder 5 via the rubber mat 6 and the fixing bracket 7.

The push plate 8 has a front surface which comes into contact with two pushing points (i.e., the two pins 52a, 52b) of the sensor holder 5. Further, the push plate 8 has a rear surface which comes into contact with two pushing points (the push switch 92a and the pressure sensor 93) of the main substrate 9. The push plate 8 is swung by being pressed from the two pushing points 52a and 52b of the sensor holder 5, and thereby, pressing the push switch 92a and the pressure sensor 93.

(Main Substrate)

The main substrate 9 includes a substrate body 91, the plurality of (e.g., four) push switches 92a, 92b, 92c, and 92d, the pressure sensor 93, the light source 94, an internal connector 95, an external connector 96, and a control circuit 97. The substrate body 91 is, for example, a printed circuit board and is made of an epoxy resin containing glass.

Each of the four push switches 92a, 92b, 92c, and 92d is a switch which has a movable portion and a spring, is switched from an OFF state to an ON state when the movable portion is depressed by being pressed, and when the movable portion is no longer pressed, the movable portion autonomously is returns to its initial state by the spring, and then, the switch is switched from the ON state to the OFF state. The spring includes a metal plate with a dome shape or an elastic thin film part made of rubber. In the spring, at a timing point in which the switch is switched from the OFF state to the ON state, the elastic repulsive force becomes a minimum load by buckling deformation by being pressed. That is, a sense of click is generated. The push switch 92a is a switch which detects a push operation given to the operation panel 31. The push switch 92a is disposed on a front surface of the substrate body 91 so as to overlap the push plate 8 on the rear side of the push plate 8 and is pressed by the swing of the push plate 8. The push switch 92b is a switch which detects a push operation given to the center button 32. The push switch 92b is disposed on the front surface of the substrate body 91 so as to be at the back of the center button 32 and is pressed by the boss 3212 (see FIG. 3) of the center button 32. The push switches 92c and 92d are disposed on the front surface of the substrate body 91 so as to be respectively on the back of the side buttons 33 and 34 and are pressed by the pins 333 and 343 of the side buttons 33 and 34.

The pressure sensor 93 is a component which detects a pushing load acting on the operation panel 31 by a push operation given to the operation panel 31. The pressure sensor 93 is disposed on the front surface of the substrate body 91 so as to overlap the rear side of the push plate 8 and is pressed by the swing of the push plate 8.

The light source 94 is a light source for causing the front surface plate 322 of the center button 32 to emit light, and is disposed on the front surface of the substrate body 91 so as to be located on the rear side of the center button 32 (i.e., the rear side of the opening 8a of the push plate 8). The internal connector 95 is a part to which the line lead-out part 43 of the sensor substrate 4 is to be connected. The external connector 96 is a part which connects an external device and the control circuit 97. The control circuit 97 is connected to each of the push switches 92a to 92d, the light source 94, the pressure sensor 93, and the sensor substrate 4. The control circuit 97 controls these components, processes signals output from these components, and outputs these signals to the external device via the external connector 96.

In the present embodiment, as described above, the input device 1 includes the first pressing member 15 and the second pressing member 8. The first pressing member 15 has two pushing points (i.e., two pins 52a, 52b) (contact points) on its rear surface, and the two pushing points 52a and 52b contact the front surface of the second pressing member 8. The main substrate 9 has two pushing points (i.e., the push switch 92a and the pressure sensor body 110 of the pressure sensor 93 (see FIG. 11) (contact points)), and the two pushing points 92a and 110 contact the rear surface of the second pressing member 8. In the input device 1, the first pressing member 15 is swung when the operation panel 31 receives a push operation, and this swing swings the second pressing member 8, and the second pressing member 8 presses the push switch 92a and the pressure sensor 93.

Figure 7:
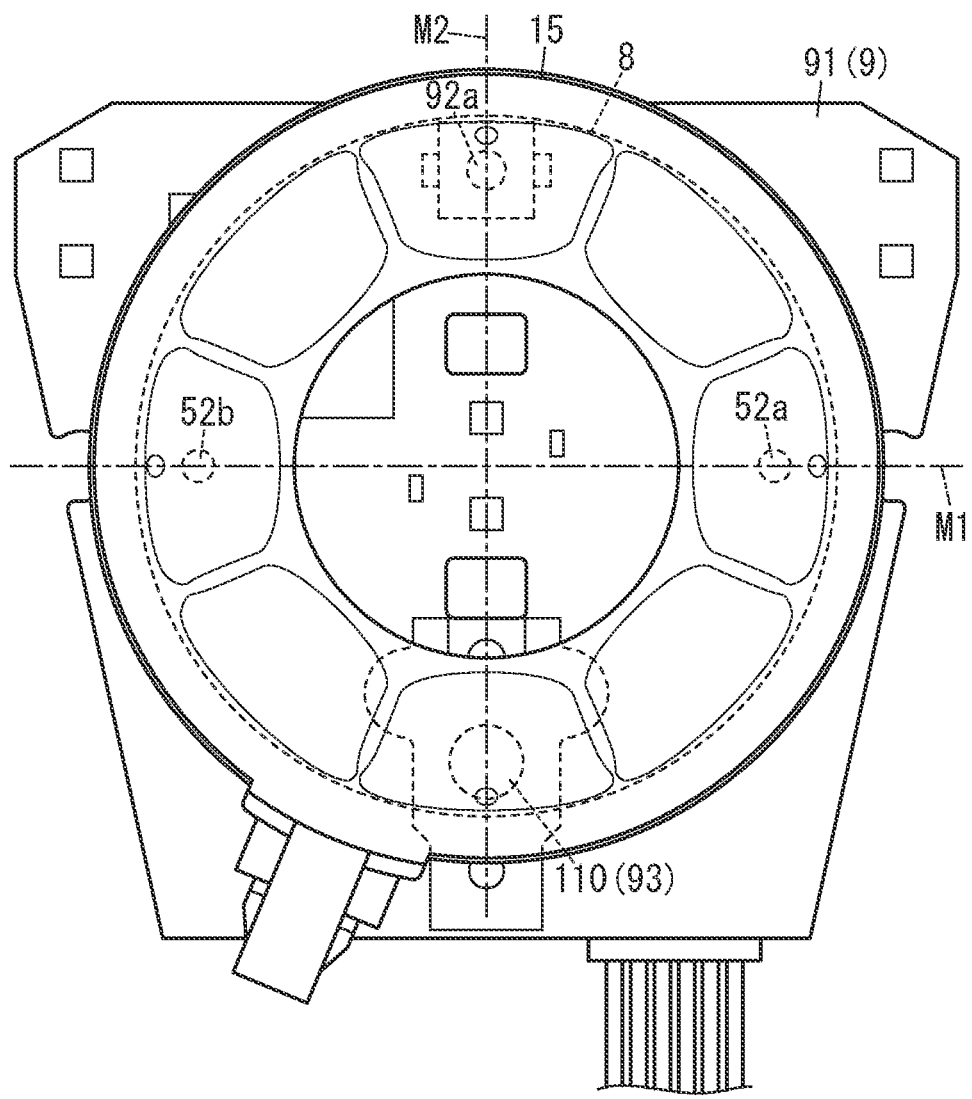
FIG. 7 is an explanatory view of an arrangement relationship of two pushing points, a pressure sensor, and a push switch.

Further, the pushing points 52, 52b, 92a, and 110 are arranged such that a line segment M1 connecting the two pushing points 52a and 52b intersects (e.g., is orthogonal to) a line segment M2 connecting the two pushing points 92a and 110 when viewed from the normal direction to the main substrate 9 (see FIG. 7). Thus, as described in detail later, no matter which position in the circumferential direction on the operation panel 31 receives a push operation, substantially the same pushing load acts on the push switch 92a and the pressure sensor 93 (in particular, the pressure sensor 93) as long as the pushing load by the push operation is the same. Consequently, no matter which position on the operation panel 31 is pushed, substantially the same pushing load is detected by the pressure sensor 93 as long as the pushing load is the same.

The line segment M2 connecting the two pushing points 110 and 92a of the second pressing member 8 and the main substrate 9 is a bisector of the line segment M1 connecting the two pushing points 52a and 52b of the first pressing member 15 and the second pressing member 8. The two pushing points 52a and 52b of the first pressing member 15 and the second pressing member 8, and the two pushing points 92a and 93 of the second pressing member 8 and the main substrate 9 are located at vertices of a substantial square. The center of the first pressing member 15 (i.e., the center of the flange 312) is the middle point of the two pushing points 52a, 52b of the first pressing member 15 and the second pressing member.

1-3. Details of Shape of Operation Panel

As shown in the drawing 8A, the front surface 311f of the operation panel 31 includes an outer circumferential rib 311b, an inner circumferential rib 311c, and projections 311d in addition to the plurality of (e.g., eight) concave surface parts 311a described above.

Figure 8A:
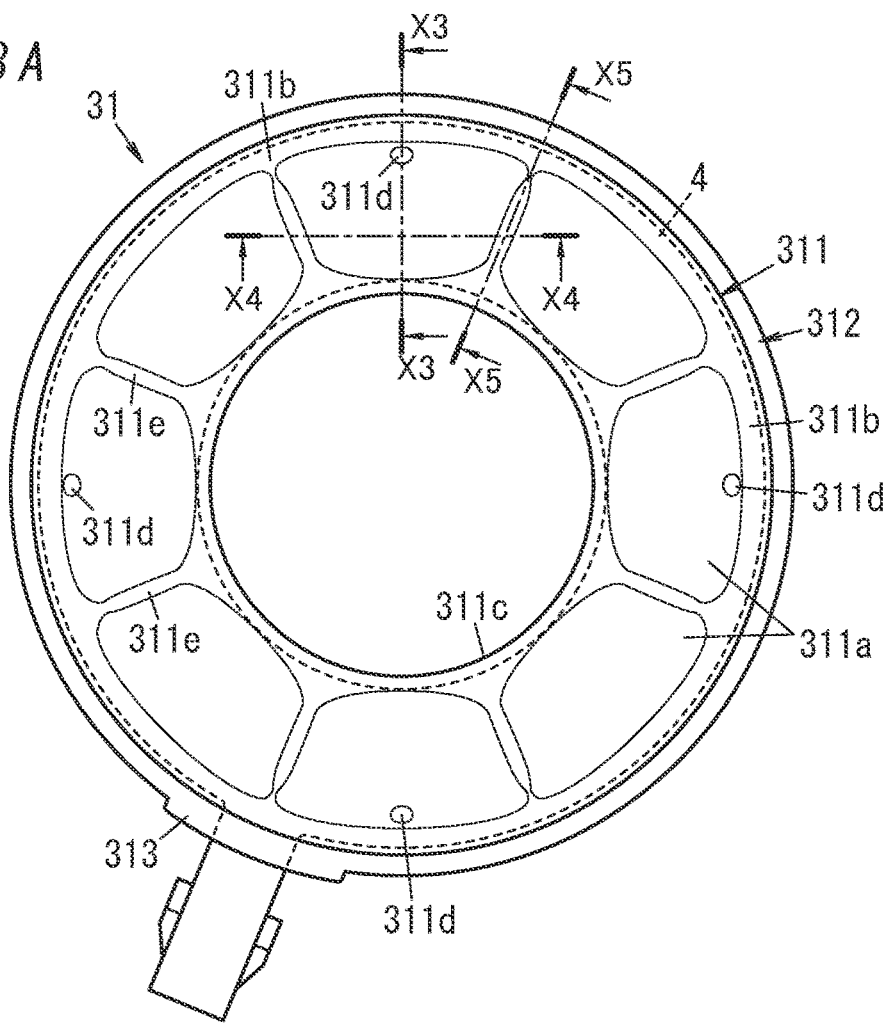
FIG. 8A is a front view of an operation panel.
Figure 8B:
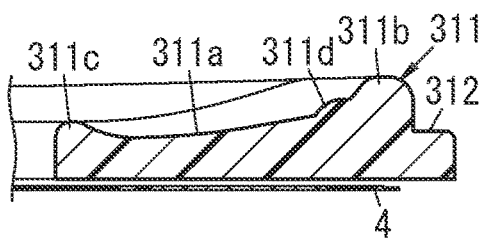
FIG. 8B is a sectional view along X3-X3 of FIG. 8A.

The outer circumferential rib 311b and the inner circumferential rib 311c protrude frontward respectively at an outer circumferential edge and the inner circumferential edge of the front surface 311f of the operation panel 31 and are annularly provided along the entire circumference (see FIG. 8B). Thus, when the front surface 311f of the operation panel 31 is traced with a finger along the circumferential direction (i.e., when the operation of the increment encoder is input), the outer circumferential rib 311b and the inner circumferential rib 311c can guide the finger in the circumferential direction of the operation panel 31. As a result, the operation of the increment encoder can be easily performed. At least one of the outer circumferential rib 311b or the inner circumferential rib 311c is provided.

The eight concave surface parts 311a are arranged on the front surface 311f of the operation panel 31 in the circumferential direction as described above and correspond to the eight directions around the operation panel 31. Thus, an arbitrary direction is selectable from the eight directions depending on the concave surface part 311a to which the touch operation is given. That is, the operation panel 31 can be used as an 8-direction switch.

Figure 8C:
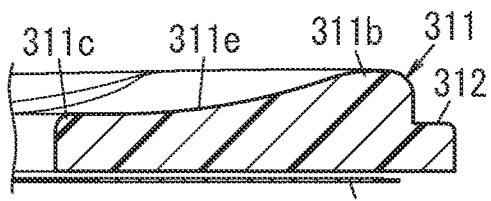
FIG. 8C is a sectional view along X5-X5 of FIG. 8A.
Figure 8D:
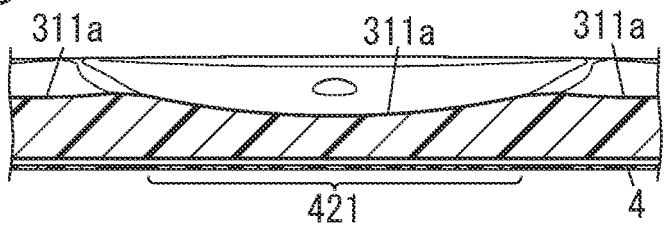
FIG. 8D is a sectional view along X4-X4 of FIG. 8A.
Figure 9A:
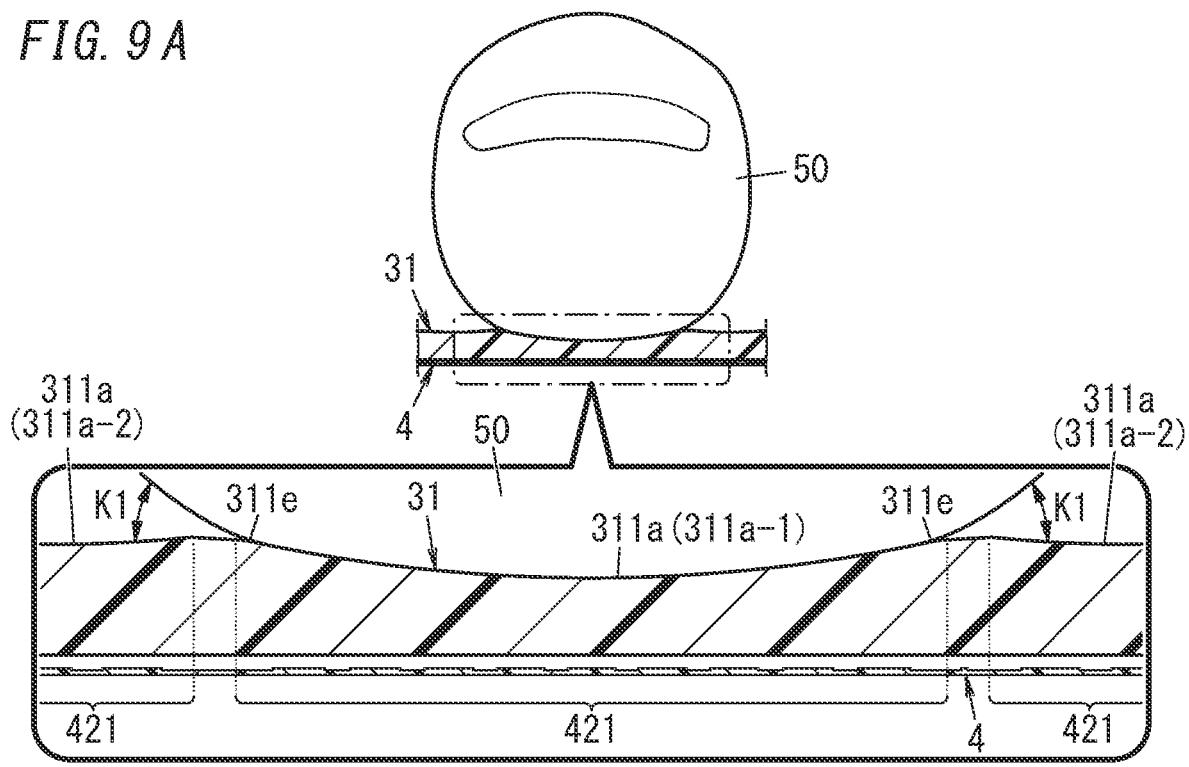
FIG. 9A is a sectional view of a contact state between a finger and the operation panel when a concave surface part is provided.
Figure 9B:
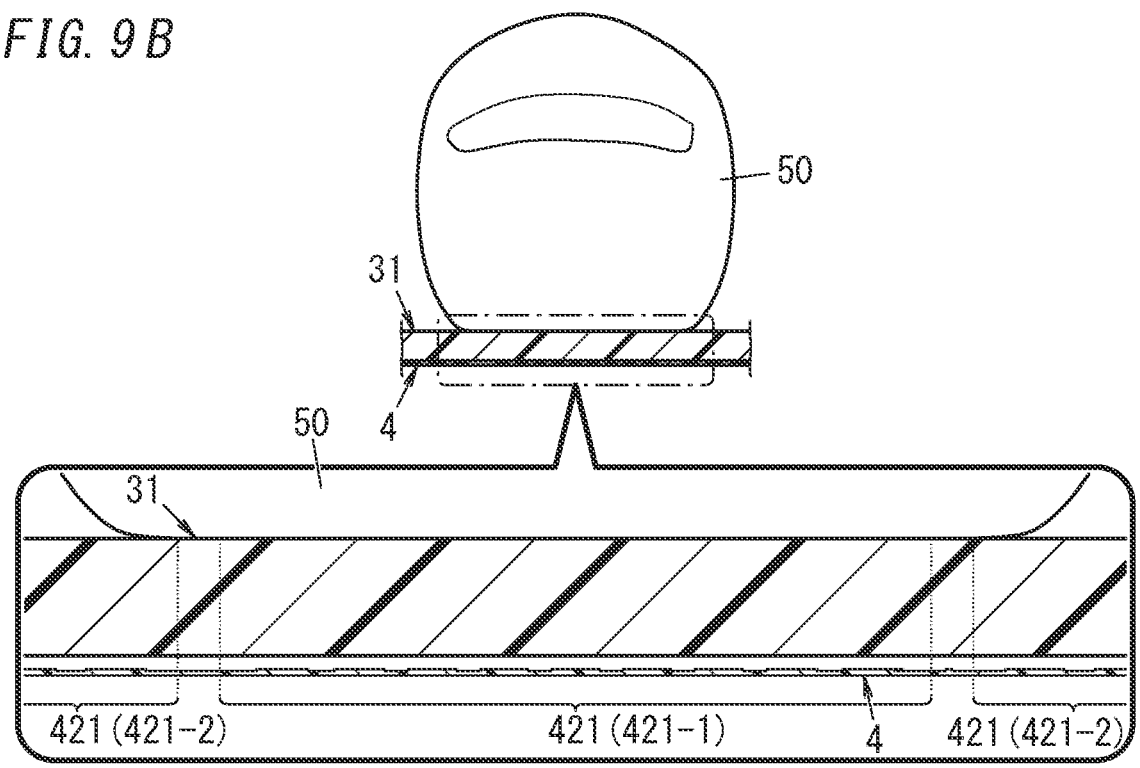
FIG. 9B is a sectional view of a contact state between the finger and the operation panel when no concave surface part is provided.

Each of the concave surface parts 311a is disposed on the front surface 311f of the operation panel 31 to overlap, on the front side, a corresponding one of the split electrodes 421 of the sensor substrate 4 (see FIG. 8D). The curvature of a front surface of each of the concave surface parts 311a is formed to substantially coincide with the curvature of the ball (inner side) of a fingertip 50 (see FIG. 9A). The distance from the fingertip 50 to each split electrode 421, that is, the thickness of the operation panel 31 is thin at the center of the concave surface part 311a and thick at the end of the concave surface part 311a. When the fingertip 50 touches any concave surface part 311a (311a-1), a gap K1 is formed between the fingertip 50 and an adjacent concave surface part 311a (311a-2) (see the drawing 9A). The strength of the electric field of the fingertip 50 on each split electrode 421 is inversely proportional to its distance and is less easily transmitted in air than in the resin. This results in a large change in the capacitance of the split electrode 421 overlapping the concave surface part 311a (311a-1) which the fingertip 50 touches and results in a suppressed change in the capacitance of the split electrode 421 overlapping the adjacent concave surface part 311a-2. Thus, the operational sensitivity of the input device 1 as an eight-way switch is improved.

In the case of the operation panel 31 having no concave surface part 311a, the fingertip 50 is placed in a region on the front surface 311f of the operation panel 31 overlapping a split electrode 421 (421-1), and in this case, the fingertip 50 contacts also a region overlapping an adjacent split electrode 421 (421-2) (9B). This reduces the operational sensitivity of the input device 1 as an eight-way switch.

The curvature of the front surface of each of the eight concave surface parts 311a substantially coincides with the curvature of the ball of the fingertip and thus forms a relatively shallow concave surface. This facilitates input of the operation of the increment encoder. The operation panel further includes borders 311e each located between the concave surface parts 311a adjacent to each other (see FIG. 8A). Each border 311e has a ridge shape extending in the radial direction of the operation panel 31 and is concavely curved along the radial direction of the operation panel 31 (see FIG. 8C). This makes it easy for the fingertip to climb over a part between the concave surface parts 311a adjacent to each other and gives an appropriate sense to the fingertip when the fingertip climbs over the part, thereby further facilitating input of the operation of the increment encoder.

The projections 311d are provided on the concave surface parts 311a, corresponding to particular directions (e.g., four directions, namely, up, down, left, and right directions) of the eight directions, of the front surface 311f of the operation panel 31. The projections 311d are provided on an inner side of the outer circumferential rib 311b of the respective concave surface parts 311a, for example. As described above, the projections 311d are provided to the concave surface parts 311a corresponding to the specific directions, and thereby, it is easily recognized that the concave surface part 311a being touched is the concave surface part 311a in the specific direction.

1-4. How to Swing Each of First Pressing Member and Second Pressing Member

Figure 10:
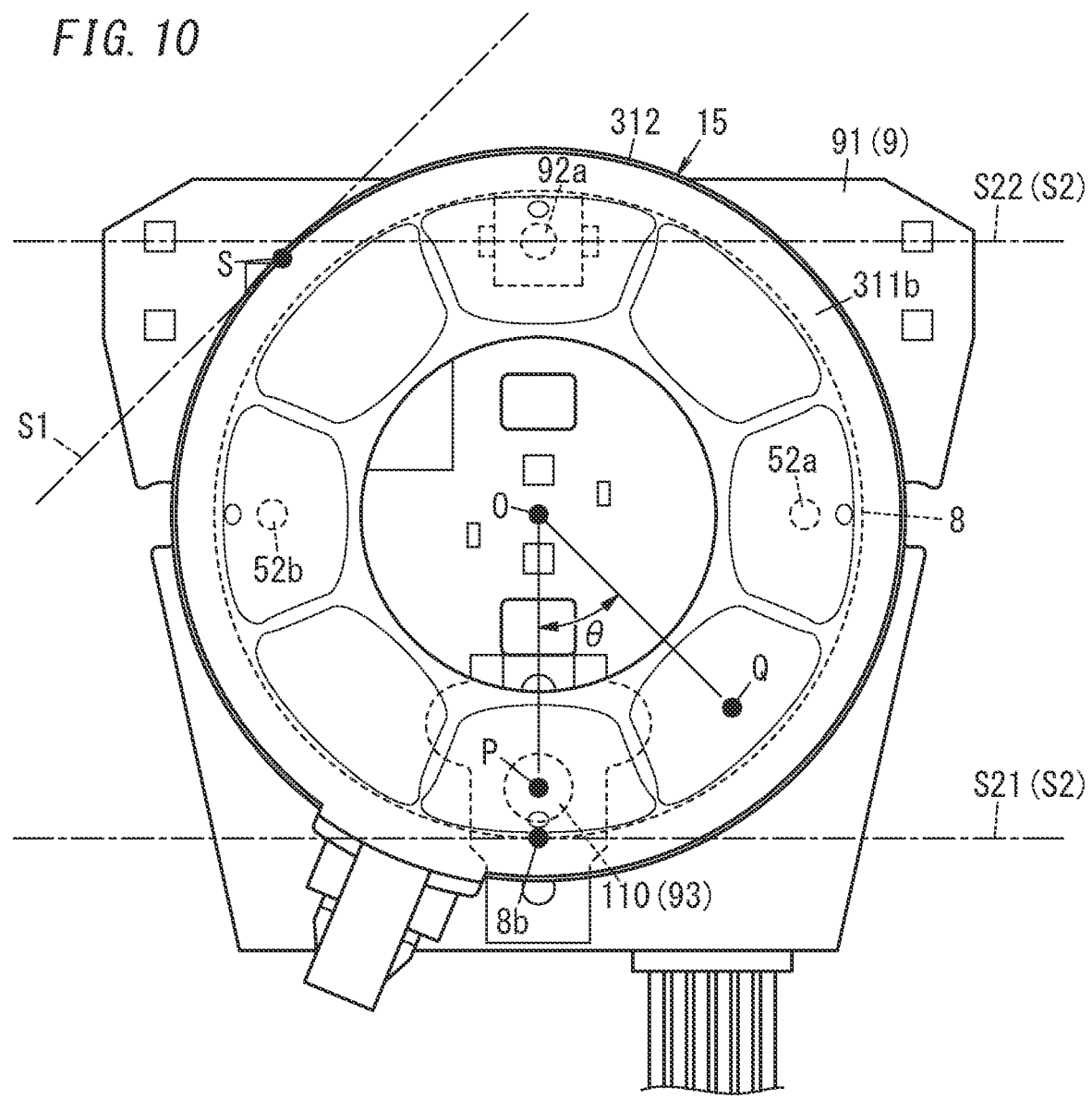
FIG. 10 is an explanatory diagram of operation of each of a first pressing member and a second pressing member.

Next, referring to FIG. 10, a description will be given of how each of the first pressing member 15 and the second pressing member 8 is swung (i.e., tilted). In FIG. 10, point O represents the center of the first pressing member 15 (i.e., the center of the flange 312), Point P represents the position of the pressure sensor body 110 (see FIG. 11) of pressure sensor 93, and point Q represents a pushed position (the position of an action point) of the front surface 311f of the first pressing member 15. Line segment OP is defined as a starting line, line segment OQ is defined as a moving radius, and θ is the angle formed between the line segment OP and the line segment OQ counterclockwise. The front side in the normal direction to the main substrate 9 is the positive direction of the Z axis, and the opposite direction is the negative direction of the Z axis.

When the point Q of the front surface 311f of the first pressing member 15 is pushed, a point S at which the straight line OQ and the outer circumference of the flange 312 of the first pressing member 15 intersect each other serves as a contact point with the circumferential edge of the rear side of the opening 21a of the cover 21. Then, the first axis S1 passing through the point S and being perpendicular to line segment SQ appears, and the first pressing member 15 tilts around the first axis S1 in the negative direction of the Z-axis. The position of the first axis S1 on the first pressing member 15 is variable corresponding to any angle θ. As the first pressing member 15 tilts, the two pushing points 52a and 52b move in the negative direction of the Z-axis. The second pressing member (push plate) 8 is pressed against a rear surface of the bracket body 71 of the fixing bracket 7 by two coil springs 120 of pressure sensor 93 being compressed. The two coil springs 120 will be described later. Since the total force of the elastic repulsive forces of the two coil springs 120 is larger than the elastic repulsive force of the spring of the push switch 92a, a point 8b at which the straight line OP and the outer circumference of the push plate 8 intersect each other serves as a contact point with the rear surface of the bracket body 71. A second axis S21 passing through the point 8b and being parallel to a straight line connecting the pushing points 52a and 52b appears, and the second pressing member 8 tilts around the second axis S21 in the negative direction of the Z-axis. Consequently, the movable portion of the push switch 92a is depressed, the push switch is switched from the OFF state to the ON state, and the movement of the movable portion then stops. Then, a second axis S22 passing through the pushing point 92a and being parallel to the straight line connecting the pushing points 52a and 52b appears, and the second axis S2 moves from the second axis S21 to the second axis S22, and the second pressing member 8 tilts around the second axis S22 in the negative direction of the Z-axis. Consequently, the second pressing member 8 pushes the pushing point 93 (i.e., the pressure sensor 93), and the pressure sensor 93 detects the pushing load of the second pressing member 8.

For the second pressing member 8, the pushing points 52a and 52b are equidistant from a straight line connecting the pushing point 92a and the point P. The distances from the second axis S2 to the pushing points 52a and 52b is half of the distance from the second axis S2 to the point P. Thus, the pushing load at the point Q is evenly distributed to the pushing points 52a and 52b, and the pushing load at the pushing points 52a and 52b is equal to the pushing load at the point P. The sum of the amounts of movement of the pushing points 52a and 52b is equal to the amount of movement of the point P.

For the first pressing member 15, the pushing points 52a and 52b are equidistant from a straight line connecting the point Q to the point S. When the distance from the point O to each of the pushing points 52a and 52b is substantially equal to the distance OQ, the distance from the first axis S1 to the pushing point 52a is OQ (1+sin θ), and the distance from the first axis S1 to the pushing point 52b is OQ (1−sin θ). The pushing load at the point P is denoted by Fp, and the pushing load at point Q is denoted by F, and in this case, Equation 1 of the balance around the first axis S1 is arranged as Equation 2. When the concave surface part 311a of the operation panel 31 is pushed, the distance OQ from the center O of the pushed position Q is substantially constant, and when the pushing load F at the point Q is the same, the force Fp transmitted to the point P (pressure sensor) is substantially constant in any direction (angle) θ.

$$(OQ+OP) \times F = (OP+OQ_{sin} \theta) \times Fp + (OP-OQ_{sin} \theta) \times Fp \quad \text{Equation 1}$$

$$Fp = \{(OQ+OP)/(2OQ)\} \times F \quad \text{Equation 2}$$

Similarly, the magnitude of movement of the point P is denoted by Tp, and the magnitude of movement of the point Q is denoted by T, and in this case, the relation expressed by Equation 3 is established between the magnitudes of movement Tp and T, and Equation 3 is arranged as Equation 4. Equation 4 shows that when the magnitude of movement T at the point Q is the same, the magnitude of movement Tp transmitted to the point P (pressure sensor) is substantially constant in any of the directions θ.

$$Tp = \{(OP+OQ_{sin} \theta)/(OQ+OP)\} \times T + \{(OP-OQ_{sin} \theta)/(OQ+OP)\} \times T \quad \text{Equation 3}$$

$$Tp = \{(2OQ)/(OQ+OP)\} \times T \quad \text{Equation 4}$$

Therefore, according to the input device 1, no matter which position on the concave surface part 311a of the operation panel 31 is pushed, substantially the same pushing load is detectable by the pressure sensor 93 as long as the pushing load is the same. No matter which position at the entire circumference of the operation panel 31 is pushed, the push operation can be detected by the push switch 92a.

As described above, the first pressing member 15 has the front surface 311f and the first axis S1 and is tiltable around the first axis S1 by the front surface 311f being pushed. The second pressing member 8 has the second axis S2 and is tiltable around the second axis S2 by being pushed due to a tilt of the first pressing member 15. The position of at least one of the first axis S1 or the second axis S2 is variable in accordance with the pushed position on the front surface 311f of the first pressing member 15.

1-5. Details of Pressure Sensor

Referring to FIGS. 11 to 14, the pressure sensor 93 will be described in detail.

Figure 11:
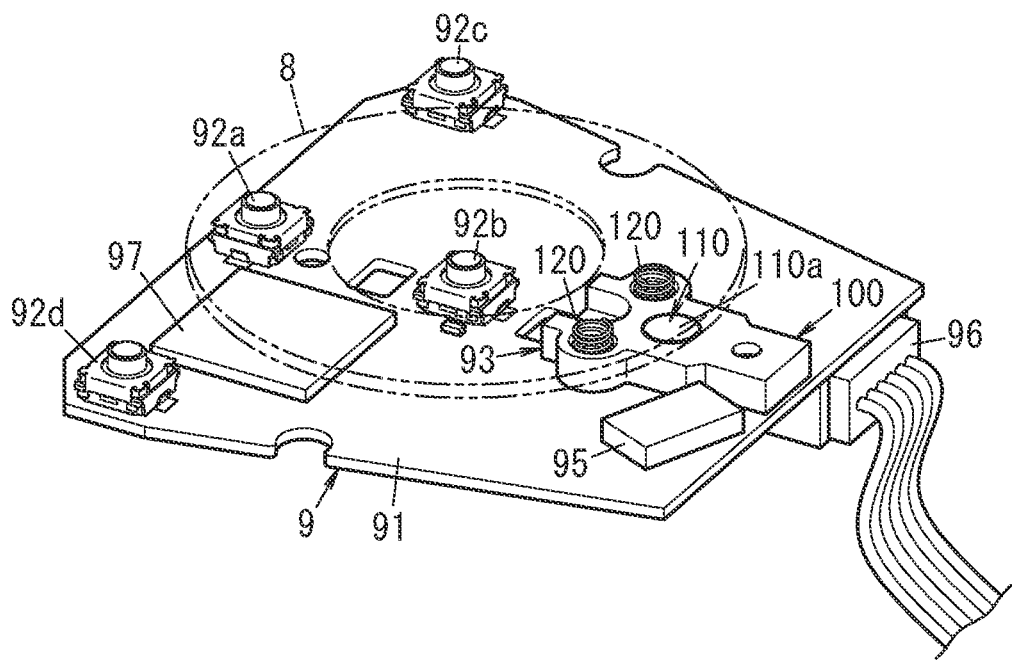
FIG. 11 is a perspective view of a main substrate.
Figure 12A:
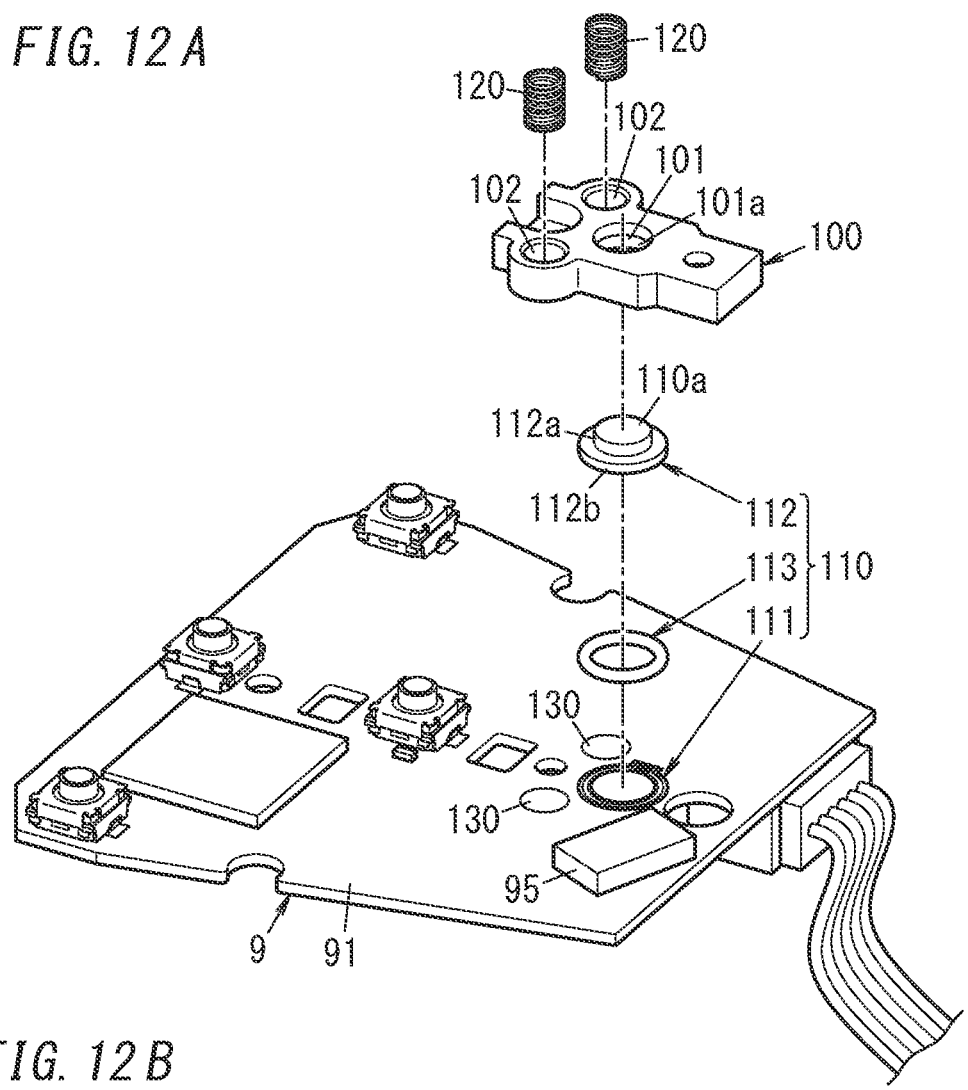
FIG. 12A is an exploded perspective view of a pressure sensor.

As shown in FIGS. 11 and 12A, the pressure sensor 93 includes a case 100, the pressure sensor body 110, and one or more (e.g., two) coil springs 120.

The case 100 is a component which fixes the pressure sensor body 110 to the main substrate 9 and holds the two coil springs 120. The case 100 is fixed to a front surface of the main substrate 9 by screws. The case 100 is made of, for example, a resin. The case 100 has a housing recess 101 and two through holes 102. The housing recess 101 is a part which houses the pressure sensor body 110. The housing recess 101 has a concave shape recessed frontward from a rear surface of the case 100. The housing recess 101 has a top surface having an opening 101a through which a front end 110a of the pressure sensor body 110 protrudes frontward. The two through holes 102 are parts which hold the two coil springs 120. The two through holes 102 tubularly penetrates the case 100 in the front/rear direction.

The pressure sensor body 110 includes a sensing electrode 111, a moving electrode 112, and an elastic member 113. The sensing electrode 111 is provided on the front surface of the main substrate 9. The moving electrode 112 is disposed in front of, and apart from, the sensing electrode 111. The moving electrode 112 is moved in the front/rear direction by the swing of the push plate 8. This changes the distance between the sensing electrode 111 and the moving electrode 112. The elastic member 113 is a member which secures a space between the sensing electrode 111 and the moving electrode 112. The elastic member 113 is made of a material having rubber elasticity and is elastically compressible and deformable. The elastic member 113 is disposed between the sensing electrode 111 and the moving electrode 112 and is elastically compressively deformed to change the space between the sensing electrode 111 and the moving electrode 112. The elastic member 113 is, for example, annular.

When the push plate 8 swings, the front end of the moving electrode 112 of pressure sensor body 110 (i.e., the front end 110a of pressure sensor body) is pressed by the push plate 8. Then, as the pushing load from the push plate 8 increases, the moving electrode 112 approaches the sensing electrode 111 against the elastic force of the elastic member 113. The capacitance of the sensing electrode 111 varies depending on the space between the sensing electrode 111 and the moving electrode 112. Therefore, a change in the potential of the sensing electrode 111 is detected, and thereby, the pushing load from the push plate 8 (i.e., the pushing load input to the operation panel 31) is detectable.

In the present embodiment, the moving electrode 112 has, for example, a substantially disk shape. More specifically, the moving electrode 112 includes a base 112a which is columnar and a flange 112b. The base 112a has a front surface which is curved like a dome. The front surface of the base 112a has an apex which is the front end 110a of pressure sensor body 110. The flange 112b is a part to be caught by a peripheral edge on the rear side of the opening 101*a* of the case 100 and protrudes outward from an intermediate portion in a columnar axis direction of an outer circumferential surface of the base 112*a*. The flange 112*b* prevents the moving electrode 112 from coming out of the opening 101*a*.

Figure 12B:
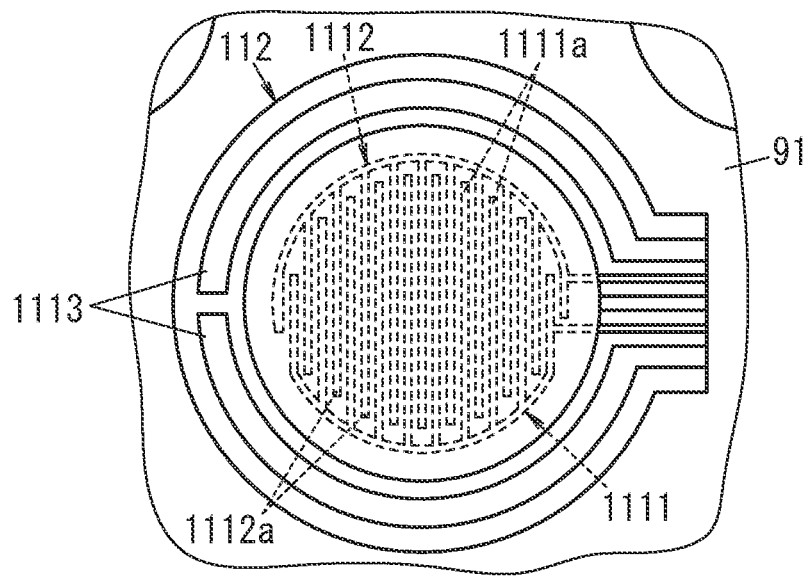
FIG. 12B is a plan view of a sensing electrode of the pressure sensor.
Figure 13:
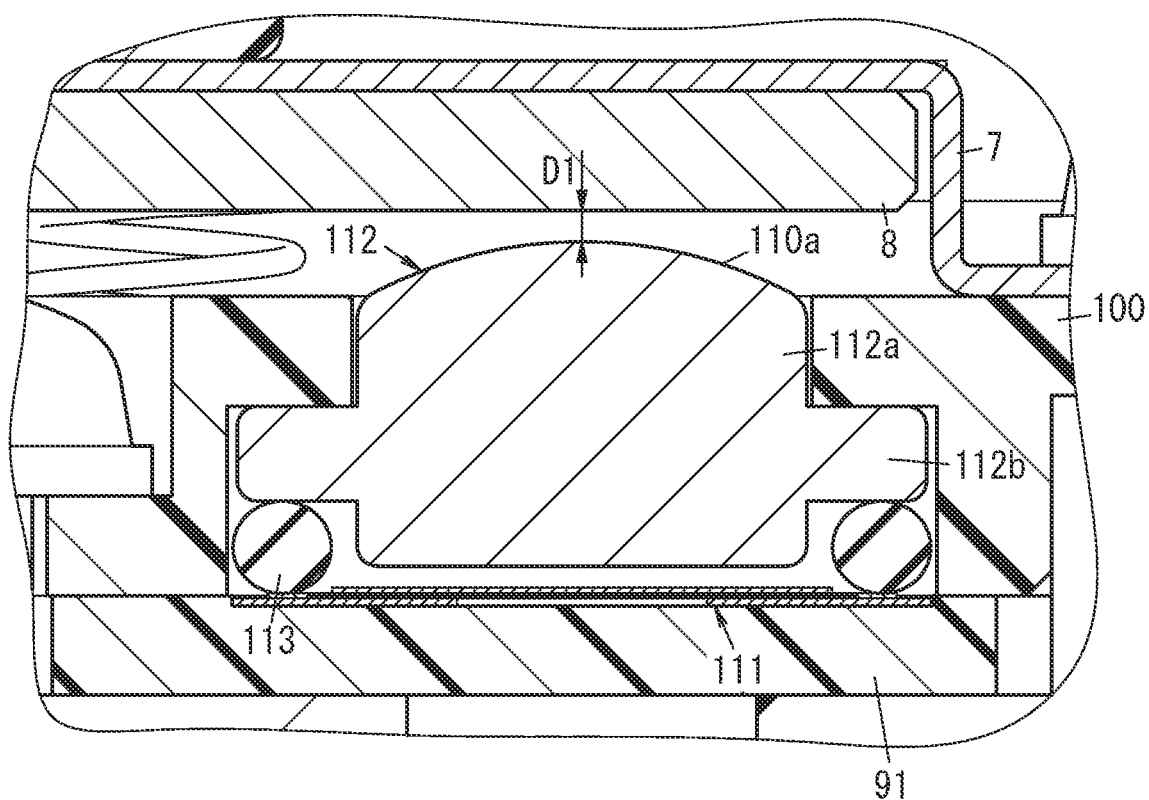
FIG. 13 is a partially enlarged view of FIG. 4.

The sensing electrode 111 includes a drive electrode 1111, a receiving electrode 1112, and reference electrodes 1113 (FIG. 12B). The drive electrode 1111 has a comb shape having a plurality of comb teeth 1111*a*, and the receiving electrode 1112 has a comb shape having a plurality of comb teeth 1112*a*. The plurality of comb teeth 1111*a* of the drive electrode 1111 are disposed between the plurality of comb teeth 1112*a* of the receiving electrode 1112. The sensing electrode 111 forms a capacitor by the drive electrode 1111 and the receiving electrode 1112 to charge an electrostatic charge between the drive electrode 1111 and the receiving electrode 1112. The electrostatic charge amount (i.e., capacitance) of the capacitor varies depending on the space between the moving electrode 112 and the sensing electrode 111. The reference electrodes 1113 surround the drive electrode 1111 and the receiving electrode 1112. The reference electrodes 1113 block external noise and are connected to a reference potential (e.g., ground potential). The drive electrode 1111 and the receiving electrode 1112 are connected to the control circuit 97 via individual lines.

The two coil springs 120 are members which are disposed between the push plate 8 and the main substrate 9 and which urge the push plate 8 frontward. The two coil springs 120 secure a distance D1 between the push plate 8 and the front end 110*a* of the pressure sensor body 110 in the standby state of the operation panel 31 (see FIG. 13). On the front surface of the main substrate 9, reference electrodes 130 are provided at respective portions with which the rear ends of the two coil springs 120 come into contact (see FIG. 12A). Each of the reference electrodes 130 is connected to a reference potential (e.g., a ground potential). Thus, the push plate 8 is connected to the reference potential via the coil springs 120 and the reference electrodes 130.

The total force of the elastic repulsive forces of the two coil springs 120 is greater than the elastic repulsive force of the spring of the push switch 92*a*. Therefore, the pushing load of the push plate 8 at first switches the push switch 92*a* from the OFF state to the ON state, the movement of the movable portion of the push switch 92*a* then stops, and thereafter, the push plate (second pressing member) 8 at the side of the pressure sensor 93 starts to be depressed.

Thus, in the input device 1, the two coil springs 120 secure the distance D1 between the push plate 8 and the front end 110*a* of the pressure sensor 93 in the standby state of the operation panel 31. Further, the push plate 8 is connected to the reference potential via the coil springs 120 and the reference electrodes 130. Thus, when a push operation given to the operation panel 31 swings the push plate 8, the push switch 92*a* is at first switched from the OFF state to the ON state, and the push plate (second pressing member) 8 at the side of the pressure sensor 93 starts being depressed as described above.

Figure 14A:
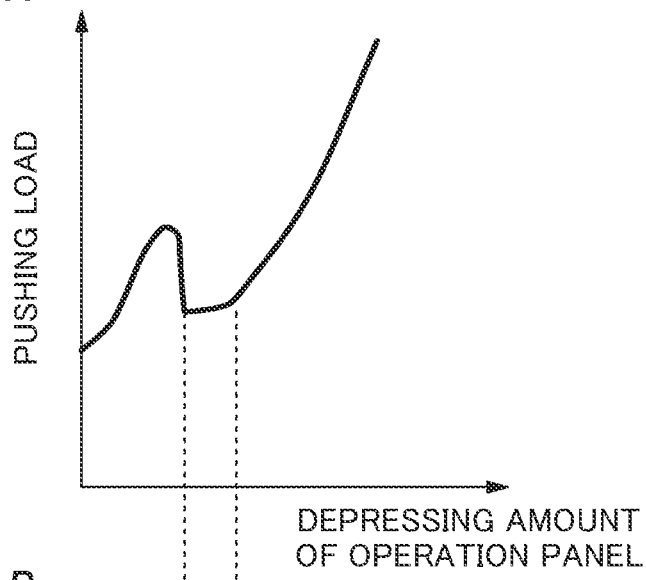
FIG. 14A is an explanatory view of a relationship between the pushing load and the magnitude of movement of a push plate.
Figure 14B:
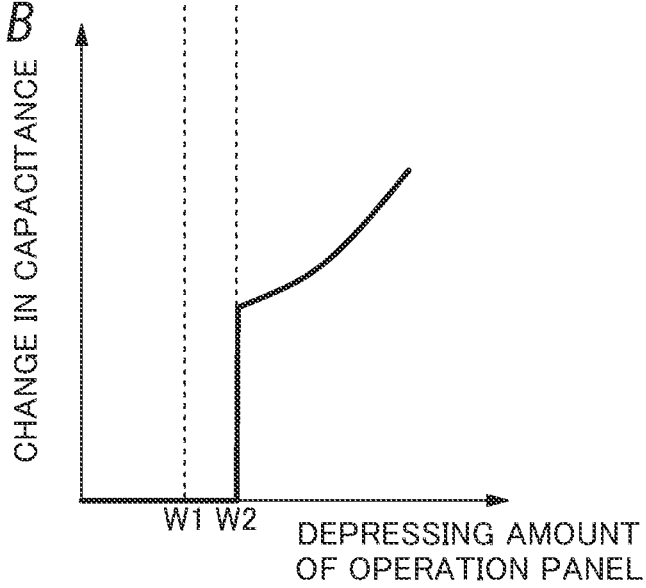
FIG. 14B is an explanatory diagram of the relation between the capacitance of the sensing electrode of the pressure sensor and the magnitude of movement of the push plate.

More particularly, as the first pressing member 15 tilts by the operation panel 31 being depressed, the two pushing points 52*a* and 52*b* press the push plate (second pressing member) 8. Since the total force of the elastic repulsive force of the two coil springs 120 is greater than the elastic repulsive force of the spring of the push switch 92*a*, the push plate 8 tilts around the second axis S21. Accordingly, as shown in FIG. 14A, the operation pushing load increases while acting on the push switch 93*a* and depresses the operation panel 31 by a predetermined magnitude of movement. Thus, the spring in the push switch 92*a* is buckled and deformed, so that elastic repulsive force becomes a minimum load, thereby giving a sense of click to the operation pushing load, and the push switch 92*a* is switched from the OFF state to the ON state (W1). The operator of the operation panel 31 can recognize that the push switch 92*a* is switched from the OFF state to the ON state by the sense of click provided by the operation panel 31.

The push switch 92*a* is switched from the OFF state to the ON state, and the movable portion of the push switch 92*a* stops moving. When the operation panel is further depressed in, the second axis S22 described above appears. The push plate 8 tilts around the second axis S22. As a result, the push plate 8 moves by the distance D1 against the elastic repulsive force of the two coil springs 120, and the push plate 8 comes into contact with the front end 110*a* of pressure sensor 93 (W2). This electrically connects the moving electrode 112 of the pressure sensor 93 to the reference electrodes 130 via the push plate 8. Thus, the potential of the moving electrode 112 changes from a floating state to the reference potential, thereby suddenly changing the capacitance of the sensing electrode 111 of pressure sensor 93. This sudden change in the capacitance is detected from the output signal of the sensing electrode 111, and thereby, the pushing load detection (pressure sensing) is started. Then, the operation panel 31 is further depressed. Thus, against the total force of the elastic repulsive forces of the two coil springs 120 and the elastic repulsive force due to the compressive deformation of the elastic member 113, the push plate 8 is moved backward. Thus, the moving electrode 112 is moved backward by the push plate 8, thereby reducing the space between the moving electrode 112 and the sensing electrode 111. This reduction increases the amount of change in capacitance between the movable power 112 and the sensing electrode 111. The capacitance between the movable power 112 and the sensing electrode 111 is detected from the output signal of the sensing electrode 111, thereby detecting the pushing load of the push plate 8 (i.e., the pushing load input to the operation panel 31).

1-6. Operation

Next, the operation of input device 1 will be described in order.

When the operation panel 31 is pressed, as described above, the first axis S1 and the second axis S2 appear at positions according to the pressed position on the operation panel 31, and the first pressing member 15 and the second pressing member 8 tilt around the first axis S1 and the second axis S2, respectively. Thus, no matter which position in the entire circumferential direction of the operation panel 31 is pushed, the pressure sensor 93 and the push switch 92*a* are pressed with substantially the same pushing load as long as the pushing load is the same. At that time, the push switch 92*a* is at first switched from the OFF state to the ON state, and thereafter, the pressure sensor 93 starts detecting the pushing load.

Further, when a touch operation is given to the operation panel 31, the sensor substrate 4 detects the touch position of the touch operation. Thus, the operation of the 8-direction switch and the operation of the increment encoder can be input. Further, when each of the push buttons 32, 33, and 34 receives a push operation, a corresponding one of the push switches 92b, 92c, and 92d is switched from the OFF state to the ON state, and the push operation is detected.

1-7. Major Effects

As described above, the input device 1 according to the present embodiment includes the first pressing member 15, the second pressing member 8, and the main substrate 9. The first pressing member 15 has the front surface (operation surface) 311f and the first axis S1 and is tiltable around the first axis S1 by the front surface 311f being pushed. The second pressing member 8 has a second axis S2 and is tiltable around the second axis S2 by being pushed due to a tilt of the first pressing member 15. The main substrate 9 includes the pressure sensor 93 to be pushed by the second pressing member 8. A position of the first axis S1 on the first pressing member 15 is variable in accordance with a pushed position on the operation surface 311f.

With this configuration, no matter which position on the front surface 311f of the first pressing member 15 is pushed, substantially the same pushing load is detectable by the pressure sensor 93 as long as the push operation with the same pushing load is given. That is, as long as the push operation is performed with the same pushing load, the detection sensitivity of the pushing loads is suppressed from varying due to differences in the operating positions of operation surface 311f.

2. Variations

Variations of the embodiment will be described. In the following description, differences from the embodiment will be mainly described, the same components as those in the embodiment are denoted by the same reference signs as those in the embodiment, and the description thereof may be omitted in some cases.

(First Variation)

In the embodiment described above, the contact surface between the first pressing member 15 and the housing 2 may be positioned to overlap the two pushing points 52a, 52b (contact points) of the first pressing member 15 and the second pressing member 8 and the two pushing points 92a and 110 (contact points) of the second pressing member 8 and the main substrate 9 when viewed from a direction perpendicular to the main substrate 9. Thus, a holding state of the first pressing member 15 and the second pressing member 8 is further stabilized.

(Second Variation)

In the embodiment described above, the first pressing member 15 has a circularly annular shape in plan view but may have a rectangular annular shape in plan view, or may be a circular or rectangular shape in plan view.

(Third Variation)

In the embodiment described above, when the push plate 8 tilts, the push switch 92a is at first switched from the OFF state to the ON state (i.e., after the switching ON and OFF of the push switch 9), and the pressure sensor 93 then detects the pushing load of the push plate 8. However, the pressure sensor 93 may first detect the pushing load of the push plate 8, and then, the push switch 92a may be switched from the OFF state to the ON state. In the embodiment described above, the example in which the push switch 9 is switched from the OFF state to the ON state has been described, but the push switch 9 may be switched from the ON state to the OFF state.

3 Summary

An input device (1) of a first aspect includes a first pressing member (15), a second pressing member (8), and a substrate (9). The first pressing member (15) has an operation surface (311f) and a first axis (S1) and is tiltable around the first axis (S1) by the operation surface (311f) being pushed. The second pressing member (8) has a second axis (S2) and is tiltable around the second axis (S2) by being pushed by the first pressing member (15) thus tilted. The substrate (9) includes at least one pressure sensor (93) which is to be pushed by the second pressing member (8). A position of the first axis (S1) in the first pressing member (15) is variable in accordance with a pushed position on the operation surface (311f).

With this configuration, no matter which position on the operation surface (311f) is pushed, substantially the same pushing load is detectable as long as the push operation is performed with the same pushing load. That is, as long as the push operation is performed with the same pushing load, the detection sensitivity of the pushing loads is suppressed from varying due to differences in the operating positions of operation surface (311f).

In an input device (1) of a second aspect referring to the first aspect, the at least one pressure sensor (93) includes a sensing electrode (111) and a moving electrode (112). The sensing electrode (111) is disposed on the substrate (9). The moving electrode (112) faces the sensing electrode (111) and is movable toward the sensing electrode (111). The second pressing member (8) is electrically conductive and is configured to be connected to a reference potential. The second pressing member (8) is configured to come into, and out of, contact with the moving electrode (112) in accordance with a tilt of the second pressing member (8).

With this aspect, the at least one pressure sensor (93) sensitively detects a timing point in which the second pressing member (8) presses the moving electrode (112) of the at least one pressure sensor (93).

In an input device (1) of a third aspect referring to the second aspect, the substrate (9) includes at least one switch (92a) configured to be switched between an OFF state and an ON state in accordance with the tilt of the second pressing member (8).

With this aspect, both pressure and a switching operation are detectable from one push operation given to the operation surface (311f).

In an input device (1) of a fourth aspect referring to the third aspect, the at least one pressure sensor (93) is configured to, when the second pressing member (8) tilts, detect a pushing load of the second pressing member (8) after switching of ON and off of the at least one switch (92a) by the second pressing member (8).

When this aspect, when a push operation is given to the operation surface (311f), the pushing load by the push operation is detectable after a switch operation by the push operation is detected.

In an input device (1) of a fifth aspect referring to any one of the first to fourth aspects, the first pressing member (15) includes a touch sensor (4) configured to detect a touch position on the operation surface (311f) by an operator.

With this aspect, the touched position on the operation surface (311f) is further detectable.

In an input device (1) of a sixth aspect referring to any one of the first to fifth aspects, the second pressing member (8) and the substrate (9) are configured to come into contact with each other at two contact points including the at least one pressure sensor (93). The first pressing member (15) and the second pressing member (8) are configured to come into contact with each other at two contact points. A line segment (M1) connects the two contact points (52a, 52b) of the first pressing member (15) and the second pressing member (8)

to each other. A line segment (M2) connects the two contact points (92a, 110) of the second pressing member (8) and the substrate (9) to each other. The two contact points (52a, 52b) and the two contact points (92a, 110) are disposed such that the line segment (M1) intersects the line segment (M2).

This aspect stabilizes a holding state of the first pressing member (15) and the second pressing member (8).

In an input device (1) of a seventh aspect referring to the sixth aspect, the line segment (M2) is a bisector of the line segment (M1). The line segment (M2) connects the two contact points (92a, 110) of the second pressing member (8) and the substrate (9). The line segment (M1) connects the two contact points (52a, 52b) of the first pressing member (15) and the second pressing member (8).

This aspect further stabilizes the holding state of the first pressing member (15) and the second pressing member (8).

In an input device (1) of an eighth aspect referring to any one of the first to seventh aspects, two contact points (52a, 52b) of the first pressing member (15) and the second pressing member (8) and two contact points (92a, 110) of the second pressing member (8) and the substrate (9) are at vertices of a substantial square.

With this aspect, pressing of the operation surface (311f) is detectable by the at least one pressure sensor (93) without requiring a large change in pushing force depending on positions on the operation surface (311f).

An input device (1) of a ninth aspect referring to any one of the first to eighth aspects further includes a holding member (2) configured to hold the first pressing member (15) and the second pressing member (8) together with the substrate (9). The first pressing member (15) is configured to come into contact, in an annular shape, with the holding member (2). A center of the first pressing member (15) is a middle point of two contact points (52a, 52b) of the first pressing member (15) and the second pressing member (8).

This aspect further stabilizes the holding state of the first pressing member (15) and the second pressing member (8).

In an input device (1) of a tenth aspect referring to the ninth aspect, a contact surface between the first pressing member (15) and the holding member (2) is positioned to overlap the two contact points (52a, 52b) of the first pressing member (15) and the second pressing member (8) and two contact points (92a, 110) of the second pressing member (8) and the substrate (9) when viewed in a direction perpendicular to the substrate (9).

This aspect further stabilizes the holding state of the first pressing member (15) and the second pressing member (8).

In an input device (1) of an eleventh aspect referring to any one of the first to tenth aspects, the first pressing member (15) and the second pressing member (8) each have an annular shape or an annular shape surrounding a transparent member (32).

With this aspect, the interior of openings (31a, Ma) of the first pressing member (15) and the opening (8a) of the second pressing member (8) may be used for other applications (such as displays).

In an input device (1) of a twelfth aspect referring to any one of the first to tenth aspects, the at least one pressure sensor (93) includes only one pressure sensor (93).

With this configuration, multiple sensing of pressure, such as double clicks, is suppressed.

In an input device (1) of a thirteenth aspect referring to the fourth aspect, the at least one switch (92a) includes only one switch (92a).

With this configuration, multiple clicks such as double clicks can be suppressed.

REFERENCE SIGNS LIST

1 Input Device
2 Housing (Holding Member)
4 Touch Sensor
8 Second Pressing Member
8a, 31a, 51 Opening
15 First Pressing Member
52a, 52b Pin (Contact Point, Pushing Point)
92a Switch (Contact Point, Pushing Point)
93 Pressure Sensor
110 Pressure Sensor Unit (Contact Point, Pushing Point)
111 Sensing Electrode
112 Moving Electrode
311f Front Surface (Operation Surface)
M1, M2 Line Segment
S1 First Axis
S2 Second Axis

The invention claimed is:

1. An input apparatus comprising:
a first pressing member having an operation surface and a first axis, the first pressing member being tiltable around the first axis by the operation surface being pushed;
a second pressing member having a second axis, the second pressing member being tiltable around the second axis by being pushed by the first pressing member thus tilted; and
a substrate including at least one pressure sensor which is be pushed by the second pressing member,
a position of the first axis in the first pressing member being variable in accordance with a pushed position on the operation surface,
wherein the at least one pressure sensor includes:
a sensing electrode disposed on the board and
a movable electrode facing the sensing electrode and being movable toward the sensing electrode,
the second pressing member is electrically conductive and is configured to be connected to a reference potential, and
the second pressing member is configured to come into, and out of, contact with the moving electrode in accordance with a tilt of the second pressing member.

2. The input device of claim 1, wherein the substrate includes at least one switch configured to be switched between an OFF state and an ON state in accordance with the tilt of the second pressing member.

3. The input apparatus of claim 2, wherein the at least one pressure sensor is configured to, when the second pressing member tilts, detect a pushing load of the second pressing member after switching ON and OFF of the at least one switch by the second pressing member.

4. The input apparatus of claim 1, wherein the first pressing member includes a touch sensor configured to detect a touch position on the operation surface by an operator.

5. The input apparatus of claim 1, wherein
the second pressing member and the substrate are configured to come into contact with each other at two contact points including the at least one pressure sensor,
the first pressing member and the second pressing member are configured to come into contact with each other at two contact points, and the two contact points of the second pressing member and the substrate and the two contact points of the first pressing member and the second pressing member are disposed such that a line segment connecting the two contact points of the first pressing member and the second pressing member intersects a line segment connecting the two contact points of the second pressing member and the substrate.

6. The input apparatus of claim 5, wherein the line segment connecting the two contact points of the second pressing member and the substrate is a bisector of the line segment connecting the two contact points of the first pressing member and the second pressing member.

7. The input apparatus of claim 1, wherein two contact points of the first pressing member and the second pressing member and two contact points of the second pressing member and the substrate are located at vertices of a substantial square.

8. The input apparatus of claim 1, further comprising a holding member configured to hold the first pressing member and the second pressing member together with the substrate, wherein
the first pressing member is configured to come into contact, in an annular shape, with the holding member, and
a center of the first pressing member is a middle point of two contact points of the first pressing member and the second pressing member.

9. The input device of claim 8, wherein a contact surface between the first pressing member and the holding member is positioned to overlap the two contact points of the first pressing member and the second pressing member and two contact points of the second pressing member and the substrate when viewed in a direction perpendicular to the substrate.

10. The input apparatus of claim 1, wherein the first pressing member and the second pressing member each have an annular shape or an annular shape surrounding a transparent member.

11. The input apparatus of claim 1, wherein the at least one pressure sensor includes only one pressure sensor.

12. The input device of claim 2, wherein the at least one switch includes only one switch.

13. An input apparatus comprising:
a first pressing member having an operation surface and a first axis, the first pressing member being tiltable around the first axis by the operation surface being pushed;
a second pressing member having a second axis, the second pressing member being tiltable around the second axis by being pushed by the first pressing member thus tilted; and
a substrate including at least one pressure sensor which is be pushed by the second pressing member,
a position of the first axis in the first pressing member being variable in accordance with a pushed position on the operation surface, wherein
the second pressing member and the substrate are configured to come into contact with each other at two contact points including the at least one pressure sensor,
the first pressing member and the second pressing member are configured to come into contact with each other at two contact points, and
the two contact points of the second pressing member and the substrate and the two contact points of the first pressing member and the second pressing member are disposed such that a line segment connecting the two contact points of the first pressing member and the second pressing member intersects a line segment connecting the two contact points of the second pressing member and the substrate.

14. The input device of claim 13, wherein the substrate includes at least one switch configured to be switched between an OFF state and an ON state in accordance with the tilt of the second pressing member.

15. The input apparatus of claim 14, wherein the at least one pressure sensor is configured to, when the second pressing member tilts, detect a pushing load of the second pressing member after switching ON and OFF of the at least one switch by the second pressing member.

16. The input apparatus of claim 13, wherein the first pressing member includes a touch sensor configured to detect a touch position on the operation surface by an operator.

17. The input apparatus of claim 13, wherein the line segment connecting the two contact points of the second pressing member and the substrate is a bisector of the line segment connecting the two contact points of the first pressing member and the second pressing member.

18. The input apparatus of claim 13, wherein a line segment connecting two contact points of the first pressing member and the second pressing member and a line segment connecting two contact points of the second pressing member and the substrate are located at vertices of a substantial square.

19. The input apparatus of claim 13, further comprising a holding member configured to hold the first pressing member and the second pressing member together with the substrate, wherein
the first pressing member is configured to come into contact, in an annular shape, with the holding member, and
a center of the first pressing member is a middle point of two contact point of the first pressing member and the second pressing member.

20. The input device of claim 19, wherein a contact surface between the first pressing member and the holding member is positioned to overlap the two contact points of the first pressing member and the second pressing member and two contact points of the second pressing member and the substrate when viewed in a direction perpendicular to the substrate.

* * * * *